(12) United States Patent
Grube et al.

(10) Patent No.: US 8,464,133 B2
(45) Date of Patent: Jun. 11, 2013

(54) MEDIA CONTENT DISTRIBUTION IN A SOCIAL NETWORK UTILIZING DISPERSED STORAGE

(75) Inventors: Gary W. Grube, Barrington Hills, IL (US); Timothy W. Markison, Mesa, AZ (US)

(73) Assignee: Cleversafe, Inc., Chicago, IL (US)

( * ) Notice: Subject to any disclaimer, the term of this patent is extended or adjusted under 35 U.S.C. 154(b) by 385 days.

(21) Appl. No.: 12/850,609

(22) Filed: Aug. 4, 2010

(65) Prior Publication Data

US 2011/0107185 A1 May 5, 2011

Related U.S. Application Data

(60) Provisional application No. 61/256,314, filed on Oct. 30, 2009.

(51) Int. Cl.
*G11C 29/00* (2006.01)
*G06F 11/08* (2006.01)

(52) U.S. Cl.
USPC .......................................................... 714/768

(58) Field of Classification Search
USPC .................. 714/763, 764, 768; 709/245, 247
See application file for complete search history.

(56) References Cited

U.S. PATENT DOCUMENTS

| | | | |
|---|---|---|---|
| 4,092,732 A | 5/1978 | Ouchi | |
| 5,454,101 A | 9/1995 | Mackay et al. | |
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |

(Continued)

OTHER PUBLICATIONS

Shamir; How to Share a Secret; Communications of the ACM; vol. 22, No. 11; Nov. 1979; pp. 612-613.

(Continued)

*Primary Examiner* — James C Kerveros
(74) *Attorney, Agent, or Firm* — Garlick & Markison; Timothy W. Markison

(57) ABSTRACT

A method, using a dispersed storage processing module, includes receiving media content determining social media metadata regarding the media content, encoding the media content in accordance with an error coding dispersal storage function to produce a plurality of sets of encoded data slices, identifying a plurality of memories to store the plurality of sets of encoded data slices, and sending the plurality of sets of encoded data slices to the plurality of memories when the social media metadata indicates that the media content is to be available for a local social network.

20 Claims, 15 Drawing Sheets

U.S. PATENT DOCUMENTS

| | | | |
|---|---|---|---|
| 6,438,727 B2* | 8/2002 | Kim ........................... 714/764 |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,149,945 B2* | 12/2006 | Brueggen ..................... 714/758 |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,546,427 B2* | 6/2009 | Gladwin et al. ............. 711/154 |
| 8,155,322 B2* | 4/2012 | Bellare et al. ................ 380/286 |
| 8,171,159 B2* | 5/2012 | McQuillen et al. .......... 709/238 |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2009/0182939 A1* | 7/2009 | Hluchyj et al. ............... 711/114 |
| 2009/0217136 A1* | 8/2009 | Cheng et al. .................. 714/773 |
| 2010/0023524 A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

\* cited by examiner routing table 266

| from | to | route ID | route priority | | | route | | |
|---|---|---|---|---|---|---|---|---|
| DSPU | DS Unit 1 | 1 | 2 | DSPU | R2 | R3 | R4 | DSU 1 |
| DSPU | DS Unit 1 | 2 | 2 | DSPU | R2 | R5 | R4 | DSU 1 |
| DSPU | DS Unit 1 | 3 | 1 | DSPU | R1 | R4 | DSU 1 | |
| DSPU | DS Unit 2 | 1 | 3 | DSPU | R2 | R3 | R4 | R5 |
| DSPU | DS Unit 2 | 2 | 4 | DSPU | R1 | R4 | R3 | R2 |
| DSPU | DS Unit 2 | 3 | 1 | DSPU | R2 | R5 | DSU 2 | |
| DSPU | DS Unit 2 | 4 | 2 | DSPU | R1 | R4 | R5 | DSU 2 |

FIG. 18

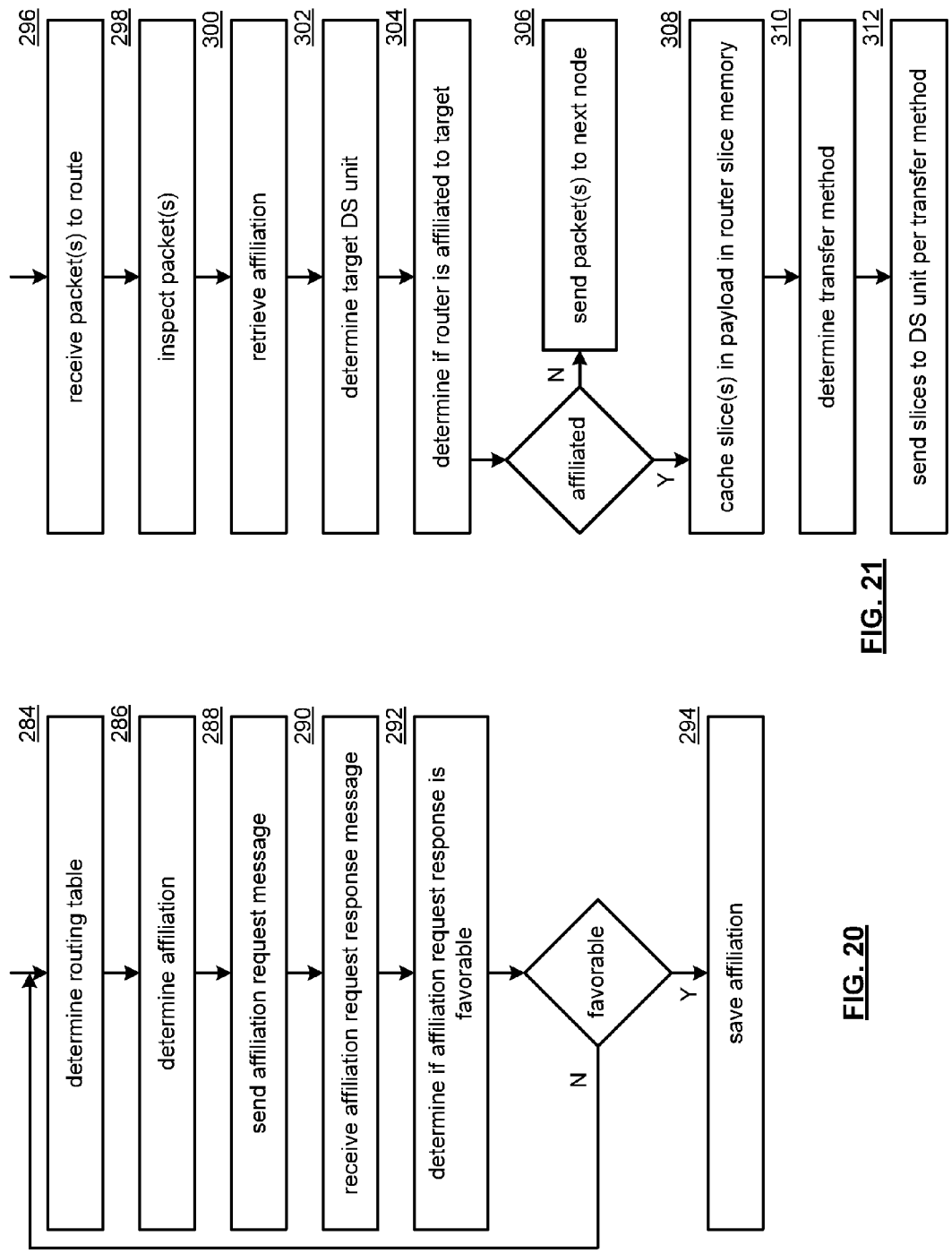

MEDIA CONTENT DISTRIBUTION IN A SOCIAL NETWORK UTILIZING DISPERSED STORAGE

CROSS REFERENCE TO RELATED PATENTS

This patent application is claiming priority under 35 USC §119(e) to a provisionally filed patent application Ser. No. 61/256,314, with a filing date of Oct. 30, 2009, entitled AUTONOMOUS DISTRIBUTED STORAGE NETWORK, which is herein incorporated by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to computing systems and more particularly to data storage solutions within such computing systems.

2. Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to use a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failures issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

FIG. 18 is an example table representing a routing table in accordance with the present invention;

FIG. 20 is a flowchart illustrating an example of affiliating routers in accordance with the present invention; and FIG. 21 is a flowchart illustrating an example of routing data in accordance with the present invention.

DETAILED DESCRIPTION OF THE INVENTION

Figure 1:
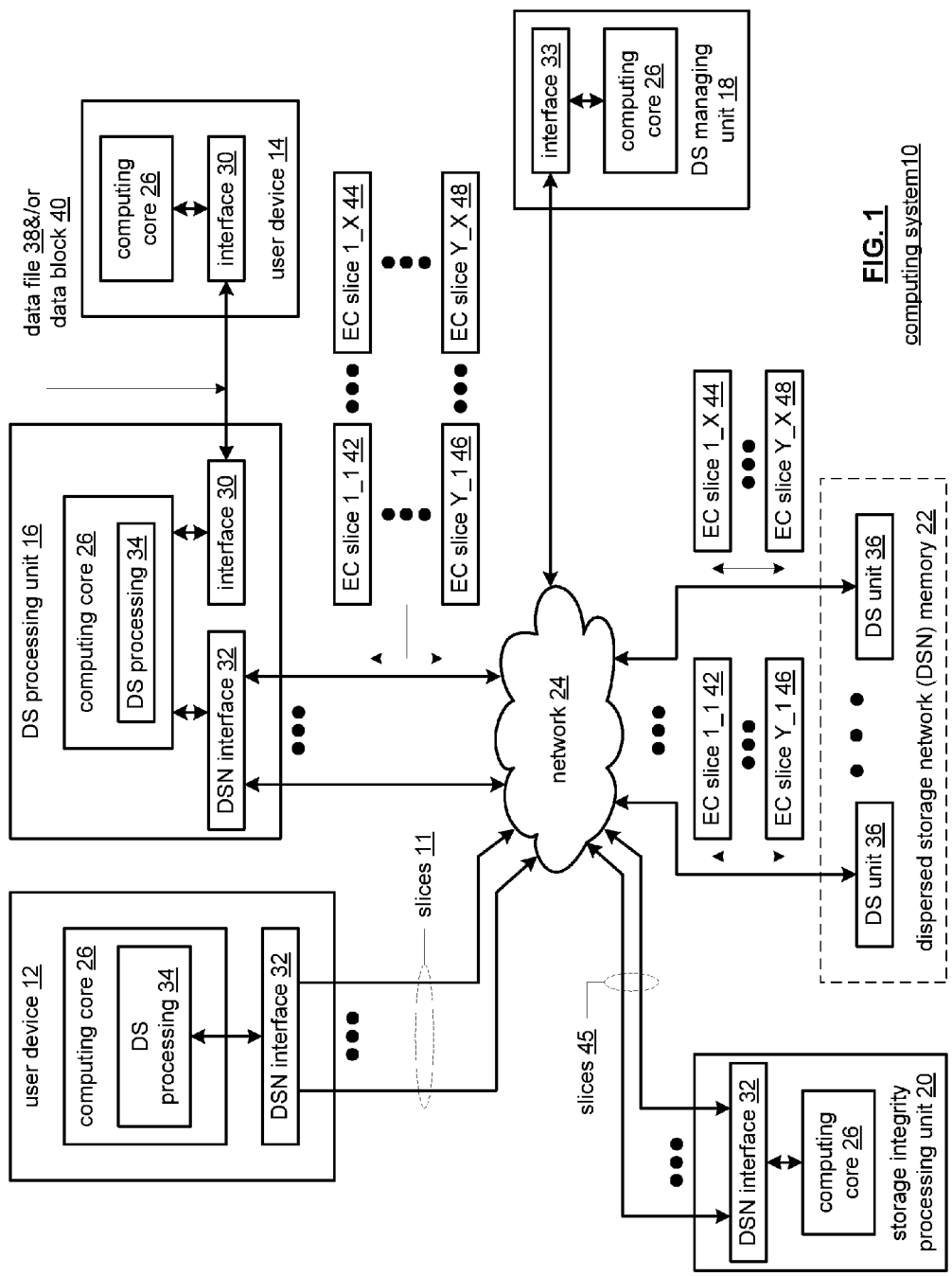
FIG. 1 is a schematic block diagram of an embodiment of a computing system in accordance with the invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-21.

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interfaces 30 support a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing module 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices and/or unit's activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 36. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it sends the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each slice 42-48, the DS processing unit 16 creates a unique slice name and appends it to the corresponding slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the slices 42-48 for transmission via the network 24.

The number of DS units 36 receiving the slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improved data storage integrity and security. Further examples of encoding the data segments will be provided with reference to one or more of FIGS. 2-21.

Each DS unit 36 that receives a slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing 34. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuild slice, or slices, in the appropriate DS unit(s) 36 in a manner that mimics the write process previously described.

Figure 2:
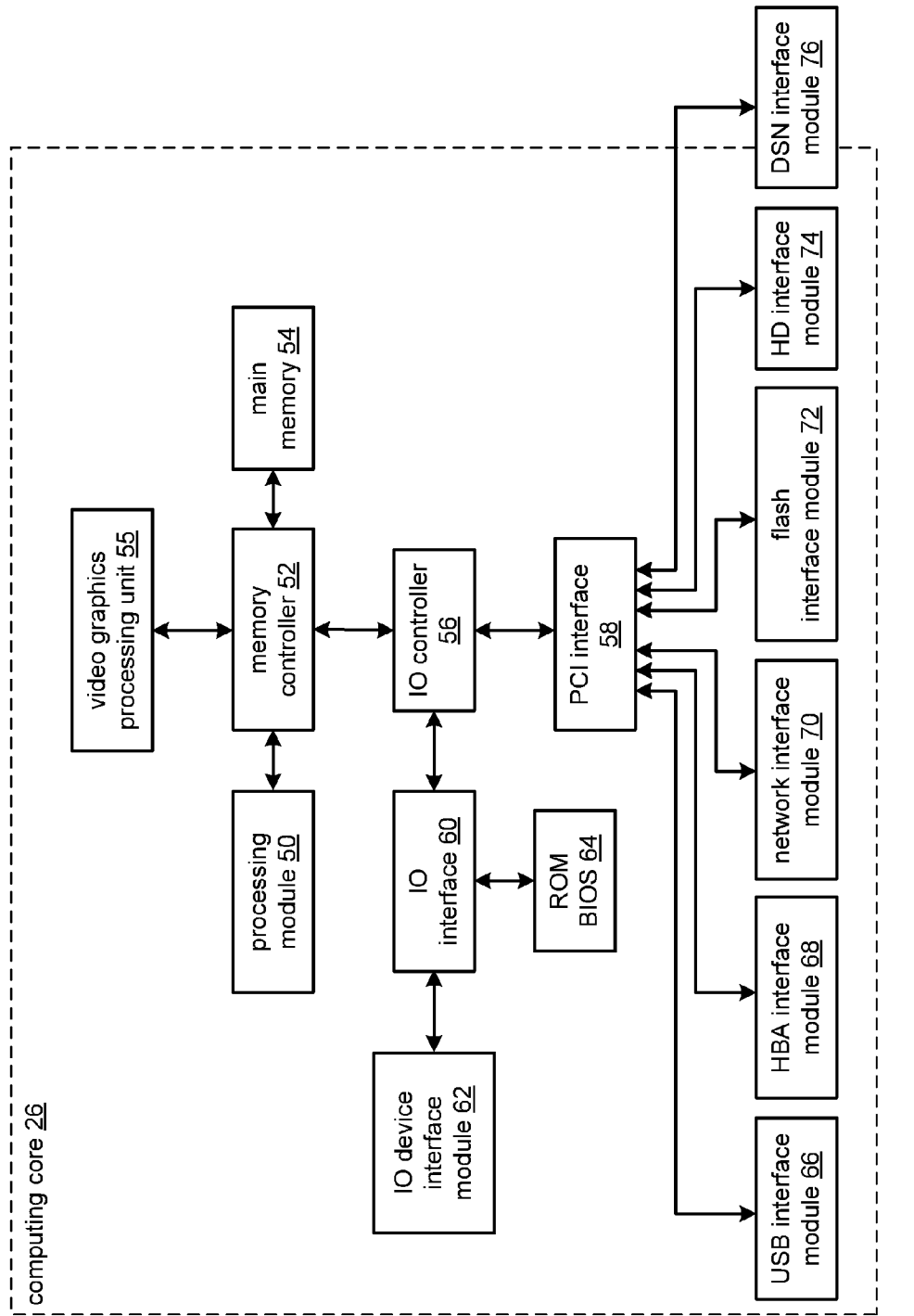
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-21.

Figure 3:
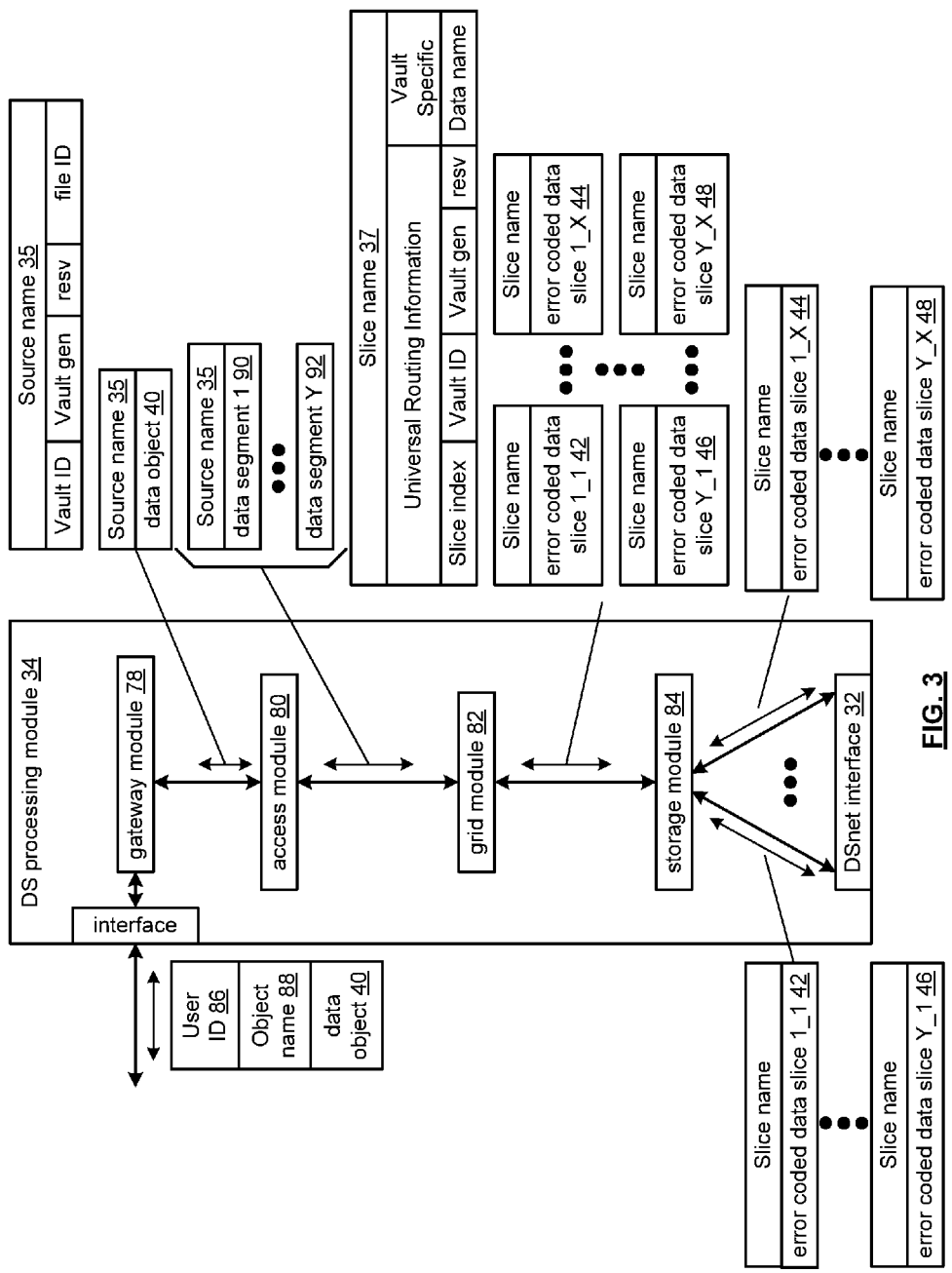
FIG. 3 is a schematic block diagram of an embodiment of a distributed storage processing unit in accordance with the invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user 12 or of the DS processing unit 14. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data object field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 60 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment sized is fixed, then the number of segments Y varies based on the size of data object. For instance, if the data object is an image file of 4,194,304 bytes and the fixed size of each segment is 4,096 bytes, the then number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X−T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 14, which authenticates the request. When the request is authentic, the DS processing unit 14 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

Figure 4:
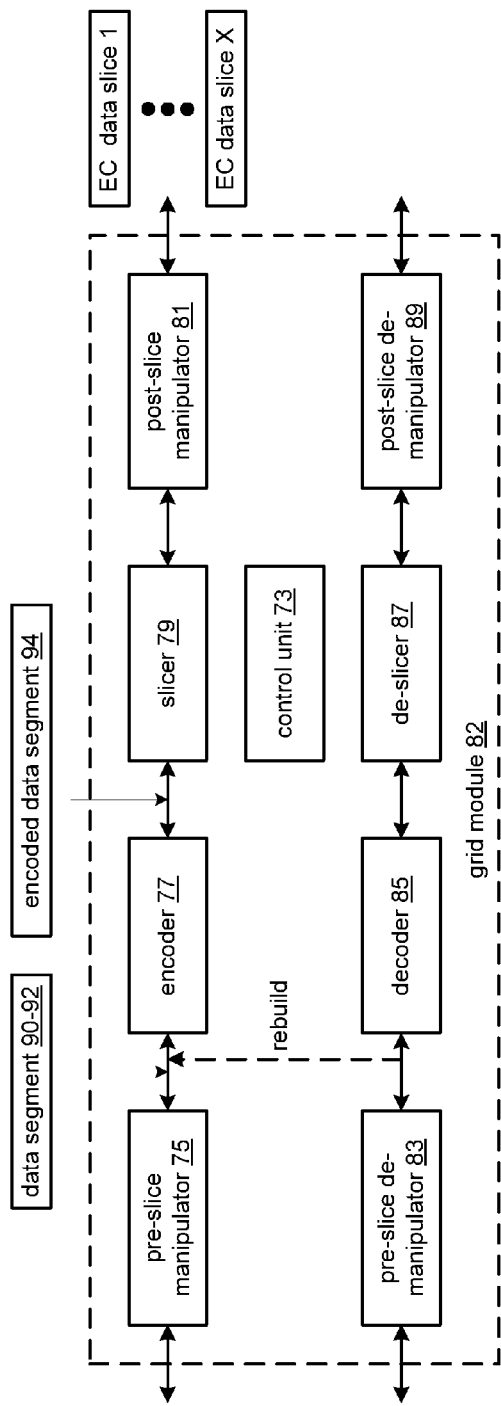
FIG. 4 is a schematic block diagram of an embodiment of a grid module in accordance with the invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X−T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

Figure 5:
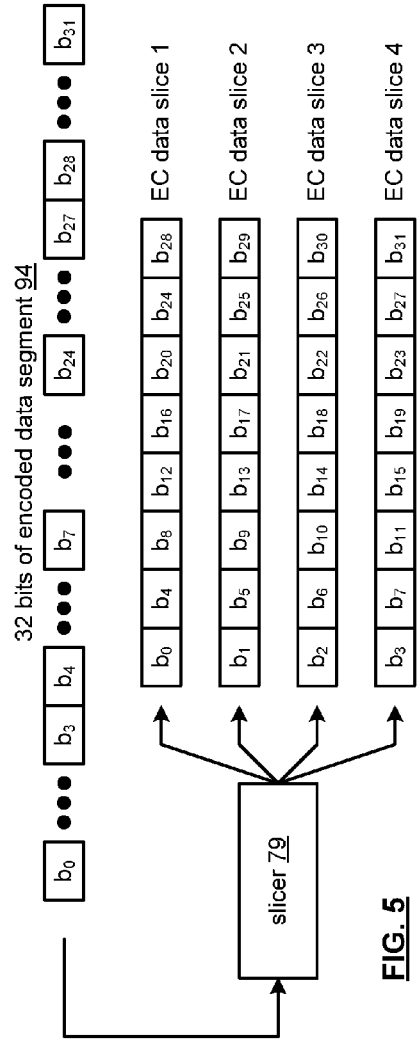
FIG. 5 is a diagram of an example embodiment of error coded data slice creation in accordance with the invention.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
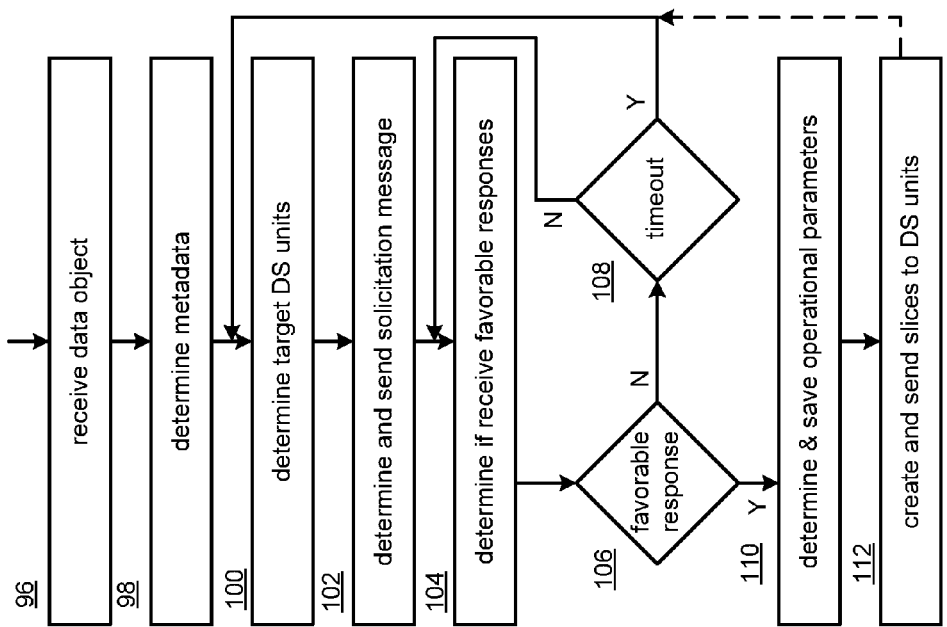
FIG. 6 is a flowchart illustrating an example of storing slices in accordance with the present invention.

FIG. 6 is a flowchart that illustrates an example of storing of slices where a DS processing module coordinates the determination of DS units to store slices to by way of a solicitation method described below. The method begins with step 96 where the DS processing module 34 obtains data for storage. For example, the DS processing module obtains the data for storage based on receiving a data object to store (e.g., from a user device) 96. In another example, the DS processing module obtains the data for storage based on retrieving data from a memory. Additionally, the DS processing module may receive a user ID, a data object name, and metadata associated with the data object.

The method continues with step 98 where the DS processing module determines metadata associated with the data. The metadata may include one or more of but not limited to a hash of the data object, a priority requirement, a security requirement, a performance requirement, a size indicator, a data type indicator, a location requirement, and a user ID. The determination may be based on one or more of but not limited to the metadata, the user ID, the data object name, a data type indicator, the data object, a calculated hash of the data object, a priority indicator, a security indicator, a performance requirement, a command, a user vault lookup, geographic location of the user device, a location requirement, and a predetermination.

The method continues with step 100 where the DS processing module determines target DS units. The determination may be based on one or more of but not limited to the metadata, a DS unit list, geographic locations of DS units, geographic location of the user device, a command, a predetermination, a DSN memory status indicator, a DS unit solicitation response history indicator, and a DSN memory performance indicator. For example, the DS processing module selects a plurality of DS units to send a solicitation broadcast message. As another example, the DS processing module interprets the metadata and determines the DS units based on the metadata. As yet another example, DS processing module may select target DS units that are estimated to at least meet the requirements indicated by the metadata and may meet other requirements imposed by a command or a predetermination. For instance, the DS processing module may target DS units with estimated sufficient memory, that have not been solicited yet for this sequence, and that are within a five-mile radius of geographic proximity to the user device to provide enhanced performance.

The method continues with step 102 where the DS processing module determines and sends a solicitation message to solicit DS units to store encoded data slices of the data. The DS processing module generates the solicitation message to include one or more of but not limited to a solicitation request, the metadata, and storage requirements. The DS processing module sends the solicitation message to the target DS units by way of one or more of a broadcast message (e.g., all DS units), a unicast message (e.g., one DS unit at a time), and/or a multicast message (e.g., to a subset of DS units organized into a subset) transmission.

The method continues with step 104 where the DS processing module determines whether favorable responses have been received from a set of DS units. The DS processing module receives a solicitation response from one or more DS units where the solicitation response includes a favorable or unfavorable indicator. The response may also include a DS unit capability indicator (e.g., how much memory is available, a performance indicator, etc). A favorable indicator indicates that the DS unit is willing to store slices and an unfavorable indicator indicates that the DS unit is not willing to store slices. In another embodiment, the DS unit may only send a solicitation response that includes the favorable indicator (e.g., it does not send a response with the unfavorable indicator). For example, the favorable responses may include at least one of first storage requirements that substantially matches requirements of the soliciting. In other words, the DS unit can meet the storage requirements. As another example, the favorable responses may include second storage requirements that encompass the requirements of the soliciting. In other words, the DS unit can provide a capability that is similar to storage requirements which may suffice. For instance, the favorable response may include a security storage requirement that may indicate that 128 bit encryption can be provided when a security storage requirement of the solicitation indicated that 256 bit encryption is required. In this example, the DS processing module may determine that 128 bit encryption encompasses the security requirement even though it is not a direct match. The method of the DS unit determination of the solicitation response is discussed in greater detail with reference to FIG. 7.

The method continues with step 106 where the DS processing module determines if sufficient favorable responses have been received based on a comparison of the storage requirements of the solicitation with the responses. Note that the DS processing module may be executing a sequence to store one slice, a batch of data segment slices for the pillar, more than one batch of data segment slices for one or more pillars, up to all slices for each data segment of the data object. In other words, the DS processing module is looking for a sufficient number DS units that will meet the sequence needs and meet the functional and performance requirements based on the metadata.

The method branches to step 108 when the DS processing module determines that favorable responses have not been received so far. The method branches to step 110 when the DS processing module determines that favorable responses have been received. At step 108, the DS processing module determines if a timeout has occurred when the DS processing module determines that sufficient favorable responses have not been received so far. The timeout time period may start when the DS processing module sent the solicitation message. The method branches back to step 104 when the DS processing module determines that the timeout has not occurred. The method branches back to step 100 when the DS processing module determines that the timeout has occurred. Note that the DS processing may try other DS units that were not sent the solicitation message. Further note that the method may continue in this loop for several iterations and in another embodiment, the DS processing may retry DS units that have already been sent the solicitation message (e.g., the DS unit status may have changed).

At step 110, the DS processing module determines error coding dispersal storage function parameters (e.g., operational parameters) based on one or more of but not limited to interpreting the metadata, the favorable responses, the number of favorably responding DS units, the DS unit capability indicator, a command, a predetermination, and a user vault lookup. The error coding dispersal storage function parameters includes at least one of a segmenting protocol, a pre-slice data manipulation function, a forward error correction, encoding function, a slicing pillar width, a post-slice data manipulation function, a write threshold, and a read threshold. For example, the DS processing module interprets the metadata and establishes a slicing pillar width in accordance with the metadata. In an instance, the DS processing module interprets the metadata to determine a reliability requirement and chooses the slicing pillar width to be 16 such that the pillar width meets the reliability requirement and when the number of favorable responses from the DS units is equal to or greater than 16. In another example, the DS processing module adjusts the error coding dispersal storage function and/or the error coding dispersal storage function parameters when the number of the favorable responses is less than the slicing pillar width. In an instance, the DS processing module may choose a write threshold to be 15 when the slicing pillar width is 16 but there were only 15 DS units returning favorable responses.

In another example, the DS processing module chooses the pillar width n to be less than the number of favorably responding DS units and much larger than the read threshold. In another example, the DS processing may choose multiple DS unit storage sets comprising the favorably responding DS units such that the slices of different data segments may be sent to different DS unit storage sets. The DS processing module may include the storage set choices in the operational parameters.

In the continuation of step 110, DS processing module saves the error coding dispersal storage function parameters in the user vault and/or another memory. The DS processing module may or may not save the DS unit choices. The DS processing module may save the DS unit choices in a user vault, a virtual DSN address (e.g., slice name) to physical location table, and/or another memory. In one embodiment, the DS processing performs subsequent slice retrievals through another solicitation method when the DS processing does not save the DS unit choices. In another embodiment, the DS processing performs subsequent slice retrievals by looking up in memory where the slices are stored when the DS processing saves the DS unit choices. The retrieval method is discussed in greater detail with reference to FIGS. 8-9.

The method continues at step 112 where the DS processing module encodes the data to produce encoded data slices in accordance with the favorable responses and the error coding dispersal storage function utilizing the error coding dispersal storage function parameters. The DS processing module sends the encoded data slices to the DS unit with a store command for subsequent storage in the DS units. Note that the DS processing module may send one slice, all the slices batched for a pillar of a data segment, all the slices of a data segment, or all the slices of all the data segments of the data object. The method may branch back to step 100 where the DS processing determines target DS units when the DS processing is not finished creating and sending slices for the data object. For example, the loop described above may repeat for the next data segment.

Figure 7:
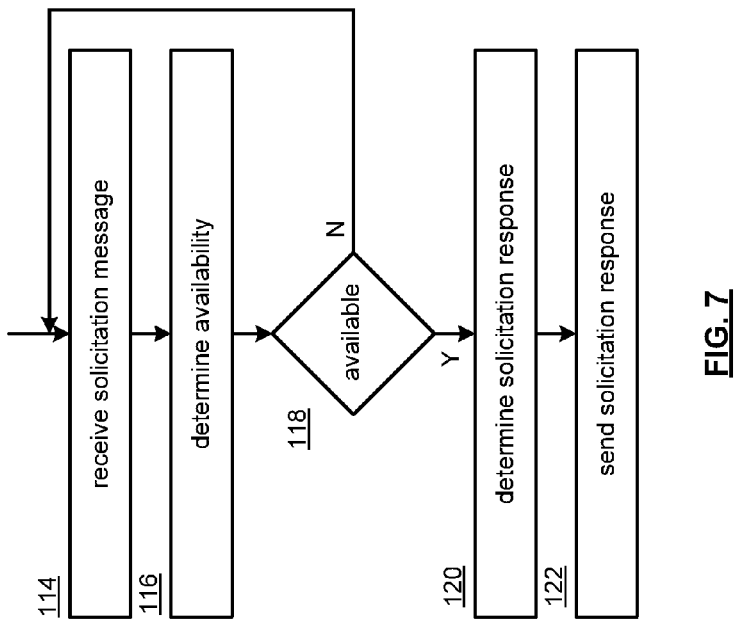
FIG. 7 is a flowchart illustrating an example of a response to a solicitation to store slices in accordance with the present invention.

FIG. 7 is a flowchart illustrating the response to a solicitation to store slices where a DS unit determines how to respond to receiving a solicitation message from a DS processing module. The method may be implemented in any one of a user device, a DS processing unit, a DS managing unit, a storage integrity processing unit, and a DS unit. For example, the method is implemented in the DS unit.

The method begins at step 114 where the DS unit receives the solicitation message regarding dispersed storage of data from the DS processing 114. The solicitation message may include metadata and one or more storage requirements regarding storage of encoded data slices of the data.

The method continues at step 116 where the DS unit determines its availability based on one or more of the metadata, DS unit status, DS unit memory availability, a command, a predetermination, historic DS unit performance, and DS unit loading. The DS unit compares the one or more storage requirements with storage capabilities of the DS unit to determine availability. For example, the DS unit compares the memory requirements from the solicitation message to the memory availability and determines that the DS unit is available for this solicitation when the amount of available memory is greater than the memory requirements. The method branches back to step 114 when the DS unit determines that the DS unit is not available. Alternatively, the DS unit sends a solicitation response message to the DS processing module that includes an unfavorable indicator.

The method continues at step 120 where the DS unit determines the solicitation response message when the storage capabilities compare favorably to the one or more storage requirements. The favorable response message may include the storage capabilities substantially matches the one or more storage requirements or the storage capabilities substantially encompasses the one or more storage requirements. In an example of a response that indicates the capabilities substantially encompasses the one or more storage requirements, the DS unit may offer to store a portion of the amount requested in the solicitation. For instance, the DS unit may indicate in response that it can store 500 megabytes in the DS unit when the solicitation request metadata indicated that 1 gigabyte was requested. Note that the DS processing module adjusts the error coding dispersal storage function to reconcile any differences between the requirements and the responses by ensuring that a sufficient number of DS units are available to meet the total requirements.

Next, at step 122, the DS unit sends a favorable response message to the DS processing module that sent the solicitation. The DS unit may subsequently receive a store command, metadata, the object name, slice names, and at least one of the encoded data slices of the data to store from the DS processing module. The DS unit stores the at least one of the encoded data slices in accordance with the one or more storage requirements. In addition, the DS unit maintains a storage record of the at least one of the encoded data slices, wherein the record includes at least one of: the one or more storage requirements, the storage capabilities, a storage agreement, a slice name, a source name, a data object name, an integrity check value, and a storage location. Note that the storage agreement may include the capabilities provided to meet the requirements requested.

Figure 8:
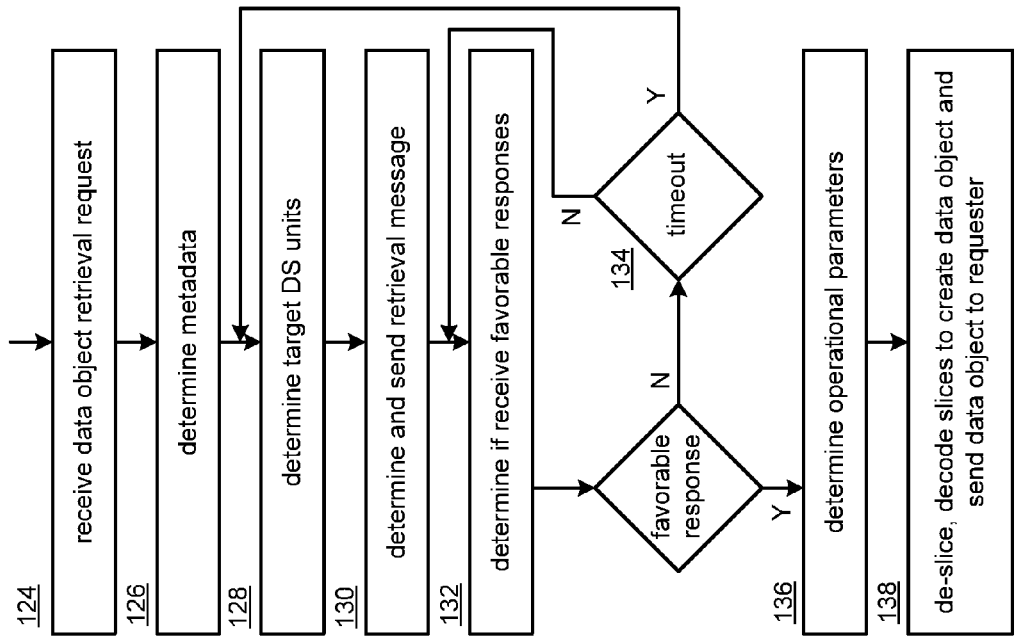
FIG. 8 is a flowchart illustrating an example of retrieving slices in accordance with the present invention.

FIG. 8 is a flowchart illustrating the retrieving of slices where a DS processing module coordinates the determination of DS units to try to retrieve slices by way of a retrieval solicitation method described below. The method begins at step 124 where the DS processing module receives a request to retrieve a data object (e.g., from a user device). The DS processing module may receive the user ID, the data object name, and metadata associated with the data object.

The method continues at step 126 where the DS processing module determines metadata such that the metadata may include one or more of but not limited to a hash of the data object, a priority requirement, a security requirement, a performance requirement, a size indicator, a data type indicator, a location requirement, and a user ID. The determination may be based on one or more of the received metadata, the user ID, the data object name, a data type indicator, a previously calculated hash of the data object, a priority indicator, a security indicator, a performance requirement, a command, a user vault lookup, geographic location of the user device, a location requirement, and a predetermination.

The method continues at step 128 where the DS processing module determines target DS units where the target DS units represent DS units that the DS processing will subsequently solicit to retrieve slices. In other words, these are the DS units where the slices are most likely stored. The determination may be based on one or more of but not limited to the metadata, a DS unit list, geographic locations of DS units, geographic location of the user device, a command, a predetermination, a DSN memory status indicator, a DS unit solicitation response history indicator, and/or a DSN memory performance indicator. The DS processing module may select target DS units that are estimated to at least meet the requirements indicated by the metadata and may meet other requirements imposed by a command or a predetermination. For example, the DS processing may target DS units with estimated sufficient memory, that have not been solicited yet for this sequence, and that are within a five-mile radius of geographic proximity to the user device to provide enhanced performance.

The method continues at step 130 where the DS processing module determines a retrieval message for the target DS units that includes a retrieval request, the metadata, slice names (e.g., based on the data object name and determined as described in FIG. 3) and may include storage requirements. At step 130, the DS processing module sends the retrieval message to the target DS units. Note that the DS processing module may send the retrieval message to the target DS units by way of one or more of a broadcast message (e.g., all DS units), a unicast message (e.g., one DS unit at a time), and/or a multicast message (e.g., to a subset of DS units organized into a subset) transmission.

The DS processing module receives a retrieval response from one or more DS units where the retrieval response includes slices. The method of the DS unit determination of the retrieval response is discussed in greater detail with reference to FIG. 9.

The method continues at step 132 where the DS processing module determines if sufficient responses have been received that in totality include enough slices to create a data segment or a series of data segments to create the data object. Note that the DS processing module may be in a sequence to retrieve one slice, a batch of data segment slices for the same pillar, more than one batch of data segment slices for one or more pillars, up to all slices for each data segment of the data object. In other words, the DS processing module is looking for a sufficient number of slices to create the slice, data segment, and/or data object. For example, the DS processing module may be looking for a read threshold k number of slices to recreate a data segment. Note that the DS processing module may determine the read threshold by a lookup in the user vault for this user ID.

The method branches to step 134 where the DS processing module determines whether a timeout has occurred when the DS processing module determines that sufficient favorable responses has not been received so far. The timeout time period may start when the DS processing sent the retrieval message. The method branches back to step 132 when the DS processing module determines that the timeout has not occurred. The method branches back to step 128 when the DS processing module determines that the timeout has occurred. Note that the DS processing module may try other DS units that were not sent the retrieval solicitation so far. Further note that the method may continue in this loop for several iterations and in another embodiment, the DS processing may retry DS units that have been sent the retrieval solicitation message (e.g., the DS unit status may have changed).

The method continues at step 136 where the DS processing module determines error coding dispersal storage function parameters based on one or more of but not limited to the metadata, the number of favorably responding DS units, the DS unit capability indicator, a command, a predetermination, and a user vault lookup. For example, the DS processing module may retrieve the storage set information from the user vault. In another example, the DS processing may retrieve multiple DS unit storage sets from the user vault when the encoded data slices of different data segments were sent to different storage sets. In another embodiment, the DS processing module performs slice retrievals by looking up in memory where the slices are stored when the DS processing module previously saved the DS unit choices.

The method continues with step 138 where the DS processing module de-slices and decodes the retrieved slices of the data object to recreate the data segment(s) in accordance with error coding dispersal storage function and the favorable responses. The DS processing module recreates the data object by recreating the data segments. Note that the method described above may loop until all of the data segments are available to form the data object. The DS processing module sends the data object to the requester.

Figure 9:
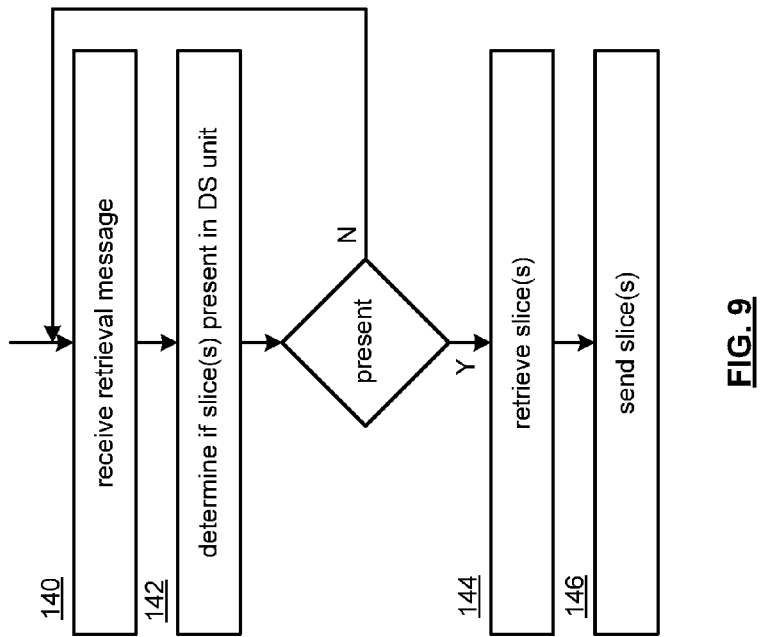
FIG. 9 is a flowchart illustrating an example of a response to a solicitation to retrieve slices in accordance with the present invention.

FIG. 9 is a flowchart illustrating the response to a solicitation to retrieve slices where the DS unit determines how to respond to receiving a retrieval message from a DS processing module. The method may be implemented in any one of a user device, a DS processing unit, a DS managing unit, a storage integrity processing unit, and a DS unit. For example, the method is implemented in the DS unit.

The method begins at step 140 where the DS unit receives a retrieval message that includes identities of a set of encoded data slices. The retrieval message may include a retrieval command, metadata, the slice names (e.g., identities), and/or the data object name.

The method continues at step 142 where the DS unit determines whether an encoded data slice of the set of encoded data slices is identified in a storage record based on one or more of a lookup in a local virtual DSN address to physical location table, a storage table lookup, the metadata, DS unit status, DS unit memory availability, a command, a predetermination, historic DS unit performance, and DS unit loading. For example, the DS unit compares the slice names from the retrieval message to the slice names in the local virtual DSN address to physical location table to look for a match (e.g., present). The method branches back to step 140 when the DS unit determines that the encoded data slice of the set of encoded data slices is not identified in the storage record. In addition, the DS unit may send a retrieval response message to the DS processing that indicates that the slice is not present. The method continues to step 144 when the DS unit determines that the encoded data slice of the set of encoded data slices is identified in this storage record.

The method continues with step 144 where the DS unit retrieves the encoded data slice(s) when the encoded data slice is identified in the record. The DS unit may determine where to retrieve the slice(s) from by looking up the location in the local virtual DSN address to physical location table. In an example, the encoded data slices are stored in the present DS unit. In another example, the slices are stored in at least one other DS unit. The method continues with step 146 where the DS unit sends a message that includes the encoded data slice as a retrieval response to the DS processing module that sent the solicitation for the encoded data slice(s).

Figure 10:
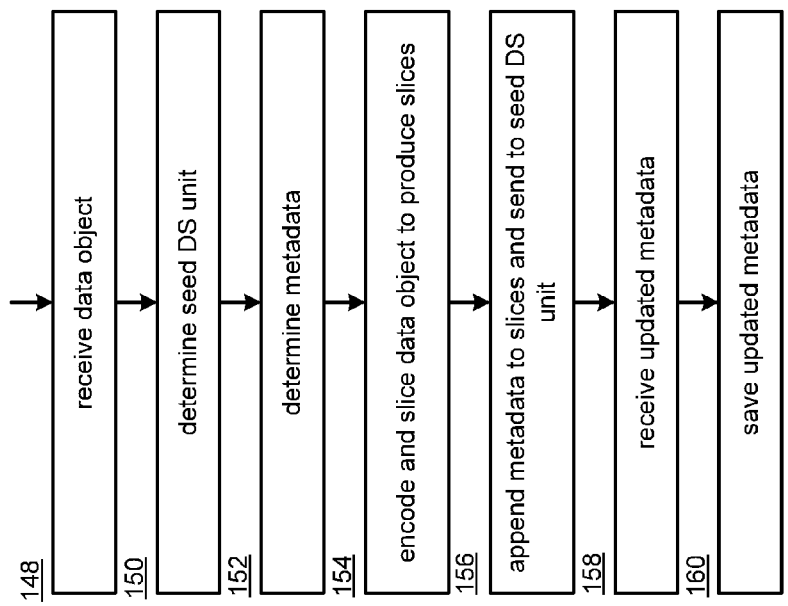
FIG. 10 is another flowchart illustrating another example of storing slices in accordance with the present invention.

FIG. 10 is another flowchart illustrating the storing of slices where a DS processing module initiates the storing of slices to a plurality of DS units in a serial fashion as described in the method below. The method begins with step 148 where the DS processing module obtains data for storage. For example, the DS processing module receives a data object to store (e.g., from a user device). The DS processing module may receive a user ID, a data object name, and metadata associated with the data object. In another example, the DS processing module retrieves data from a local memory to obtain the data for storage.

The method continues with step 150 where the DS processing module determines a proxy unit (e.g., a seed DS unit) where the DS processing module sends an initial batch of encoded data slices. In an example, the DS processing module selects one of the plurality of DS units as the proxy unit. The determination may be based on one or more of but not limited to a random choice, the metadata, a DS unit list, geographic locations of DS units, geographic location of the user device, a command, a predetermination, a DSN memory status indicator, a DS unit history indicator, and a DSN memory performance indicator. For instance, the DS processing module may select the proxy unit that is geographically close to the user device and has a history of sufficient reliability and performance.

The method continues at step 152 where the DS processing module determines metadata where the metadata may include one or more of but not limited to a hash of the data object, a priority requirement, a security requirement, a performance requirement, a size indicator, a data type indicator, a location requirement, and a user ID. The determination may be based on one or more of received metadata, the user ID, the data object name, a data type indicator, the data object, a calculated hash of the data object, a priority indicator, a security indicator, a performance requirement, a command, a user vault lookup, geographic location of the user device, a location requirement, and a predetermination.

The DS processing module determines error coding dispersal storage function parameters (e.g., operational parameters) based on one or more of but not limited to the metadata, a capability indicator of the seed DS unit, a command, a predetermination, and a user vault lookup. For example, the DS processing module may choose the pillar width n to be much larger than the read threshold k for storing a data segment in a storage set when utilizing this method. In another example, the DS processing module may choose multiple storage sets comprising one or more seed DS units such that the slices of different data segments may be sent to different storage sets (e.g., resulting in different trails). The DS processing module may include the storage set choices (e.g., pillar width n and the seed DS unit ID) in the error coding dispersal storage function parameters.

The DS processing module may save the error coding dispersal storage function parameters in the user vault, in the metadata, and/or another memory. The DS processing module may or may not save the proxy unit choices (e.g., per slice name and/or data segment ID) in the user vault, a virtual DSN address (e.g., slice name) to physical location table, and/or another memory. For example, the DS processing module performs subsequent slice retrievals through another method when the DS processing does not save the seed DS unit choices. As another example, the DS processing module performs subsequent slice retrievals by looking up in memory where the slices are stored when the DS processing saves the seed DS unit choices. The retrieval method is discussed in greater detail with reference to FIGS. 12-13.

The method continues at step 154 where the DS processing module encodes the data in accordance with an error coding dispersal storage function to produce a plurality of sets of encoded data slices. In step 156, DS processing module appends the metadata to the slices. In step 156, the processing module transmits the metadata to the proxy unit, wherein the metadata includes a dispersal approach regarding how the proxy unit is to disperse the plurality of sets of encoded data slices. The dispersal approach may include at least one of: disperse in a sequential fashion, disperse in a daisy chain fashion, disperse in a one-to-many fashion, and forward to a second proxy unit, wherein the second proxy unit disperses the plurality of sets of encoded data slices to the plurality of dispersed storage units. In step 156, a processing module transmits the plurality of sets of encoded data slices to the proxy unit, wherein the proxy unit disperses the plurality of sets of encoded data slices to a plurality of dispersed storage (DS) units in accordance with the dispersal approach. Note that the DS processing may send one slice, all the slices batched for a pillar of a data segment, all the slices of a data segment, all the slices of all the data segments of the data object. The method may branch back to step 150 when the DS processing module is not finished creating and sending slices for the data object. For example, the steps described above may repeat for the next data segment.

The method continues at step 158 where the DS processing module receives dispersed storage information (e.g., updated metadata) regarding dispersed storage of the plurality of sets of encoded data slices. The DS processing module may receive may receive the dispersed storage information from at least one DS unit along the storage trail. The dispersed storage information includes one or more of: an encoded data slice storage confirmation identifier, a DS unit identifier and at least one associated slice name, a seed DS unit identifier, an end DS unit identifier, and storage path information. Note that the DS unit identifier pertains to a DS unit along the storage trail. In other words, the trail may indicate which DS units stored which portions (e.g., slice names) of the slices.

In step 160, the DS processing module saves the updated dispersed storage information in one or more of the user vault, a virtual DSN address (e.g., slice name) to physical location table, and another memory. Note that the DS processing module may retrieve the encoded data slices in a serial fashion starting with slices stored at the proxy unit. Further note that the error coding dispersal storage function parameters may be optimized to facilitate faster data segment decoding by including data bits of the data object in a first grouping of the slices and including parity/error correction bits in a second grouping of the slices. In this fashion the first encoded data slices retrieved may contain everything to decode the data segment (e.g., when there are no errors) without retrieving further slices.

Figure 11:
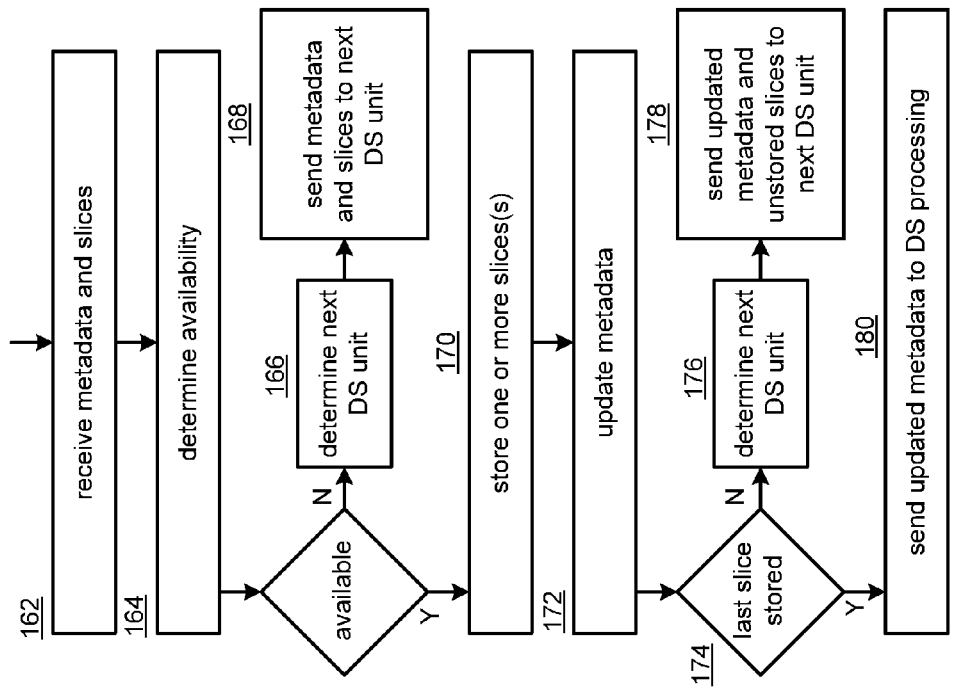
FIG. 11 is another flowchart illustrating another example of storing slices in accordance with the present invention.

FIG. 11 is another flowchart illustrating the response to a solicitation to store slices where a DS unit determines how to respond to receiving slices to store from a DS processing module. The method may be implemented in any one of a user device, a DS processing unit, a DS managing unit, a storage integrity processing unit, and a DS unit. For example, the method is implemented in the DS unit.

The method begins at step 162 where the DS unit receives a plurality of sets of encoded data slices (e.g., a pillar of slices for two or more data segments) and metadata associated with the plurality of sets of encoded data slices. In addition, the DS unit may receive a store command and slice names from the DS processing module or from another DS unit when the present DS unit is not a proxy unit in a storage trail. Note that the slices may include slices of one or more data segments and one or more pillars.

The method continues at step 164 where the DS unit determines its availability based on one or more of the metadata, DS unit status, DS unit memory availability, a command, a predetermination, historic DS unit performance, and DS unit loading. For example, the DS unit compares the memory requirements from the metadata to the memory availability and determines that the DS unit is available for this solicitation when the amount of available memory is greater than the memory requirements (e.g., to store at least a portion of the slices). The method branches to step 170 when the DS unit determines that it is available. The method continues to step 166 when the DS unit determines that it is not available.

In step 166, the DS unit determines a next DS unit. Alternatively or in addition to, the DS unit sends a storage response message to the DS processing module that includes a not available indicator (e.g., so the process may avoid this DS unit at least for a time period). The DS unit determines the next DS unit based on one or more of but not limited to the trail in the metadata, a routing table entry in a router connecting DS unit functions, a random choice, the metadata, a DS unit list, geographic locations of DS units, geographic location of the user device, a command, a predetermination, a DSN memory status indicator, a DS unit history indicator, and a DSN memory performance indicator. For example, the DS unit may select the next DS unit that is geographically close to the current DS unit (e.g., as indicated by the routing table), has a history of sufficient reliability and performance, and is not in the trail yet.

Next, at step 168, the DS unit sends the store command, encoded data slices, slice names, and metadata to the next DS unit. The DS unit interprets the metadata to determine storage instructions regarding the plurality of encoded data slices. For example, the DS unit may interpret the metadata to determine the storage instructions indicate daisy chain storage or one-to-many storage. In an example of a daisy chain storage, at step 170, the DS unit locally stores first encoded data slices of each set of encoded data slices and may update the local virtual DSN memory to physical location table. Note that the DS unit may only store as much as it determines it can store (e.g., based on available memory and the amount requested). Further note that the DS unit may only store slices of the same pillar number to improve system reliability.

The method continues at step 172 where the DS unit updates the metadata to produce updated metadata and locally stores the updated metadata. For example, the DS unit updates the metadata by adding the DS unit ID to produce the updated metadata (e.g., updated trail).

The method continues at step 174 where the DS unit determines if the DS unit is an end DS unit (e.g., the last slice has been stored) by inspecting the slice batch and what was stored locally. The method branches to step 180 when the DS unit determines that the last encoded data slice was stored locally. The method continues to step 176 when the DS unit determines that the last encoded data slice was not stored locally. At step 176 and the DS unit determines a next DS unit. The DS unit determines the next DS unit based on one or more of but not limited to the trail in the metadata, a routing table entry in a router connecting DS unit functions, a random choice, the metadata, a DS unit list, geographic locations of DS units, geographic location of the user device, a command, a predetermination, a DSN memory status indicator, a DS unit history indicator, and a DSN memory performance indicator. For example, the DS unit may select the next DS unit that is geographically close to the current DS unit (e.g., as indicated by the routing table), has a history of sufficient reliability and performance, and is not in the trail yet. At step 178, the DS unit forwards other encoded data slices of the sets of encoded data slices to at least one other DS unit (e.g., the next DS unit). Additionally, the DS unit may send the store command, slice names, and the updated metadata to the at least one other DS unit (e.g., the next DS unit).

The method continues at step 180 where the DS unit forwards the updated metadata to the DS processing module when the DS unit is the end DS unit. Alternatively, the DS unit may forward the updated metadata to the DS processing module when the DS unit is not the end unit. In addition, the DS unit may temporarily cache one up to all of the received slices and receive a confirmation from the DS processing unit or another DS unit that all of the slices have been stored before deleting the cached slices.

In an example of operation when the storage instructions indicate one-to-many storage, the DS unit transmits pillar numbered encoded data slices of the plurality of sets of encoded data slices to corresponding ones of a plurality of DS units, wherein the plurality of DS units includes the at least one other DS unit. For example, the DS unit transmits the slices for pillar 1 for each segment to DS unit one in parallel with transmitting the slices of pillar 2 for each segment to DS unit 2 in parallel with transmitting the slices of pillar three for each data segment to DS unit 3, etc. until the slices of all n (e.g., slicing pillar width) pillars for all segments are transmitted to DS units.

Figure 12:
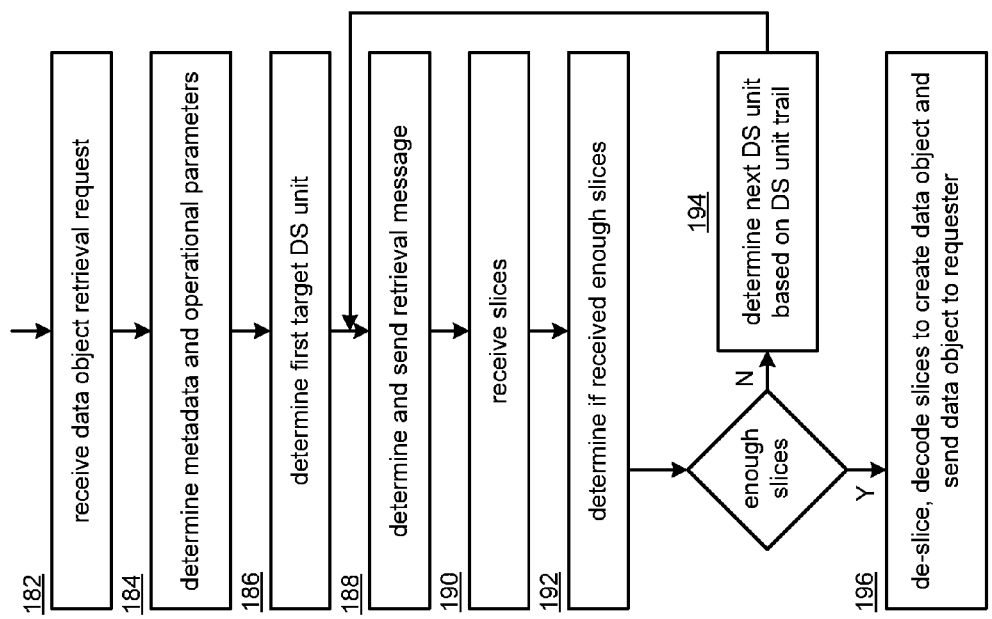
FIG. 12 is another flowchart illustrating another example of retrieving slices in accordance with the present invention.

FIG. 12 is another flowchart illustrating the retrieving of slices where a DS processing module determines a first target DS unit to start to serially retrieve encoded data slices DS unit by DS unit via a retrieval method described below. The DS processing module may be implemented in any one of a user device, a DS processing unit, a DS managing unit, a storage integrity processing unit, and a DS unit. For example, the DS processing module is implemented in the DS processing unit.

The method begins at step 182 where the DS processing module receives a request to retrieve a data object (e.g., from a user device). The DS processing module may receive the user ID, the data object name, and metadata associated with the data object.

The method continues at step 184 where the DS processing module determines metadata. The metadata may include one or more of but not limited to a hash of the data object, a priority requirement, a security requirement, a performance requirement, a size indicator, a data type indicator, a location requirement, and a user ID. The determination may be based on one or more of the received metadata, a user ID, the data object name, a data type indicator, a previously calculated hash of the data object, a priority indicator, a security indicator, a performance requirement, a command, a user vault lookup, geographic location of the user device, a location requirement, and a predetermination.

In step 184, the DS processing module determines the error coding dispersal storage function parameters (e.g., operational parameters) based on one or more of but not limited to the metadata, a DS unit capability indicator, a command, a predetermination, and a user vault. For example, the DS processing module retrieves the error coding dispersal storage function parameters including a DS unit storage set information from the user vault. In another example, the DS processing module retrieves multiple DS unit storage sets from the user vault when the slices of different data segments were sent to different DS unit storage sets.

The method continues at step 186 where the DS processing module determines a first target DS unit (e.g., proxy unit) where the target DS unit represents the seed DS unit that the DS processing module previously utilized to start the storage of slices. In other words, this is the DS unit where the slices were most likely first stored. The determination may be based on one or more of but not limited to the metadata, a lookup in the user vault, a DS unit list, geographic locations of DS units, geographic location of the user device, a command, a predetermination, a DSN memory status indicator, a DS unit response history indicator, and a DSN memory performance indicator. The DS processing module may select the first target DS unit that is estimated to at least meet the requirements indicated by the metadata and may meet other requirements imposed by a command or a predetermination. For example, the DS processing module chooses the first target DS unit with estimated sufficient memory, that has not been chosen yet for this sequence, and that is within a five-mile radius of geographic proximity to the user device to provide enhanced performance.

The method continues at step 188 where the DS processing module determines a retrieval message for the first target DS unit that includes a retrieval request, the metadata, the slice names (e.g., based on the data object name and determined as described in FIG. 3). In step 188, the DS processing module sends the retrieval message to the first target DS unit. Note that the DS processing module may determine more than one first target when more than one DS unit storage set is utilized. Further note that the DS processing module may send the retrieval message to the first target DS unit(s) by way of one or more of a broadcast message (e.g., all DS units), a unicast message (e.g., one DS unit at a time), and a multicast message (e.g., to a subset of DS units organized into a subset) transmission.

The method continues at step 190 where the DS processing module receives a retrieval response from one or more DS units where the retrieval response includes encoded data slices. The method of the DS unit determination of the retrieval response is discussed in greater detail with reference to FIG. 13.

The method continues at step 192 where the DS processing module determines if enough slices have been received from the retrieval responses to create a data segment or a series of data segments to re-create the data object. Note that the DS processing module may be in a sequence to retrieve one slice, a batch of data segment slices for the same pillar, more than one batch of data segment slices for one or more pillars, up to all slices for each data segment of the data object. In other words, the DS processing module is looking for a sufficient number of slices to create the slice, data segment, and/or data object. For example, the DS processing module may be looking for a read threshold k number of slices to re-create a data segment. Note that the DS processing module may determine the read threshold from the error coding dispersal storage function parameters (e.g., by a lookup in the user vault for this user ID).

The method branches to step 196 when the DS processing module determines that enough coded data slices have been received. The method continues to step 194 when the DS processing module determines that enough coded data slices have not been received. In step 194, the DS processing determines the next DS unit. The determination may be based on the DS unit trail in the metadata (e.g., a linked list of one DS unit to the next where the slices were previously stored). The method branches back to step 188 sends a retrieval message to the next DS unit. Note that the method may continue in this loop for several iterations. Additionally, the DS processing module may retry at least one DS unit that was previously tried (e.g., the DS unit may have been off line). Alternatively, the DS processing module performs encoded data slice retrievals by looking up in memory where the slices are stored when the DS processing module previously saved the DS unit choices.

The method continues at step 196 where the DS processing module de-slices and decodes the retrieved slices of the data object to recreate the data segment(s) in accordance with the error coding dispersal storage function parameters when the DS processing determines that enough encoded data slices have been received. The DS processing module re-creates the data object by recreating the data segments. Note that the method described above may loop until all of the data segments are available to aggregate into the data object. The DS processing module sends the data object to the requester.

Figure 13:
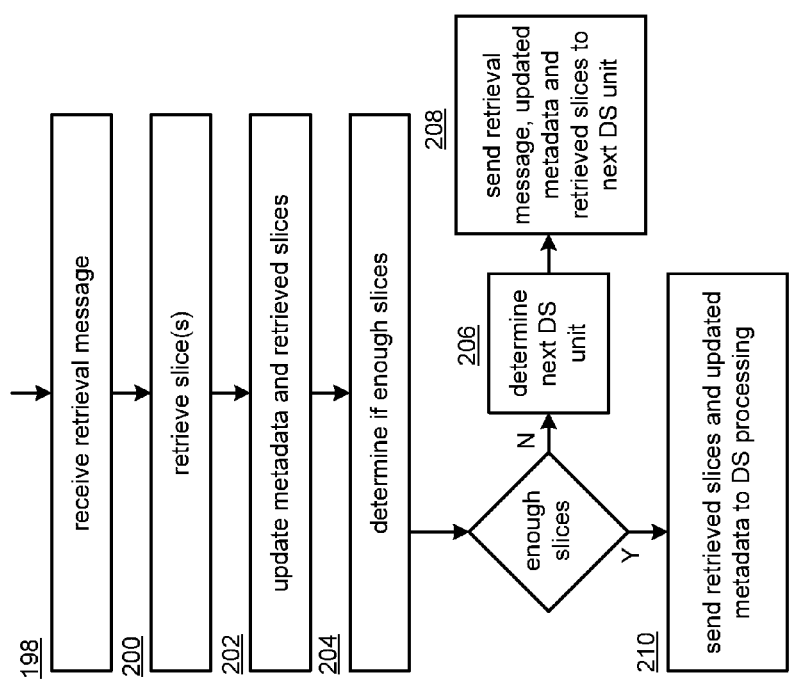
FIG. 13 is another flowchart illustrating another example of retrieving slices in accordance with the present invention.

FIG. 13 is another flowchart illustrating the retrieving of slices where the DS unit determines how to respond to receiving a retrieval message from the DS processing or another DS unit when the slices may be stored serially at different DS units. The method may be implemented in any one of a user device, a DS processing unit, a DS managing unit, a storage integrity processing unit, and a DS unit. For example, the method is implemented in the DS unit.

The method begins at step 198 where the DS unit receives the retrieval message from an initiator (e.g., the DS processing module). The retrieval message may include a retrieval command, metadata, a pool of slices retrieved so far (e.g., from other DS units on the same trail), slice names, and a data object name.

The DS unit determines whether the slices are locally stored based on one or more of a lookup in a local virtual DSN address to physical location table, the metadata, DS unit status, DS unit memory availability, a command, a predetermination, historic DS unit performance, and DS unit loading. For example, the DS unit compares the slice names from the retrieval message to the slice names in the local virtual DSN address to physical location table to look for a match (e.g., present). The method branches back to step 198 when the DS unit determines that the slice(s) are not present. Alternatively, the DS unit sends a retrieval response message to the initiator (e.g., the DS processing module) that indicates that the encoded data slice is not present.

The DS unit retrieves locally stored metadata in response to the retrieval message. In step 200, the DS unit retrieves locally stored encoded data slices in accordance with the locally stored metadata. The DS unit may determine where to retrieve the slice(s) from by looking up the location in the local virtual DSN address to physical location table. In an example, the encoded data slices are stored in the present DS unit. In another example, the encoded data slices are stored in at least one other DS unit.

The method continues at step 202 where the DS unit updates the metadata with the DS unit ID to produce updated metadata and updates the retrieved encoded data slices pool (e.g., the aggregation of all the slices retrieved so far along the DS unit storage trail). Note that the metadata now indicates that the slice pool includes slices retrieved from the present DS unit. The DS unit may send the stored encoded data slices to the initiator and/or forward the retrieval message and encoded data slices to the at least one other DS unit in accordance with the locally stored metadata.

The method continues at step 204 where the DS unit determines whether enough encoded data slices have been retrieved when either the DS unit determines that all of the possible slices have been retrieved from the DS unit storage trail or when the DS unit determines that the slice pool now contains at least a read threshold number of slices (e.g., the read threshold from the metadata). The method continues to step 206 when the DS unit determines that there are not enough encoded data slices. At step 206, the DS unit determines the next DS unit based on the DS unit storage trail in the metadata. The method continues at step 208 where the DS unit sends the retrieval message to the next DS unit where the retrieval message includes the retrieval command, the updated metadata, the pool of retrieved slices so far (e.g., from other DS units on the same trail), the slice names, and/or the data object name. The next DS unit may append more slices to the slice pool until either all the slices have been retrieved or a read threshold number of slices has been retrieved as previously described.

The method branches to step 210 when the DS unit determines that there are enough encoded data slices. At step 210, the DS unit sends the retrieval message (e.g., including the retrieved slice pool and updated metadata) to the initiator (e.g., the DS processing that sent the retrieval request) such that the initiator can decode the encoded data slices as previously discussed.

Figure 14:
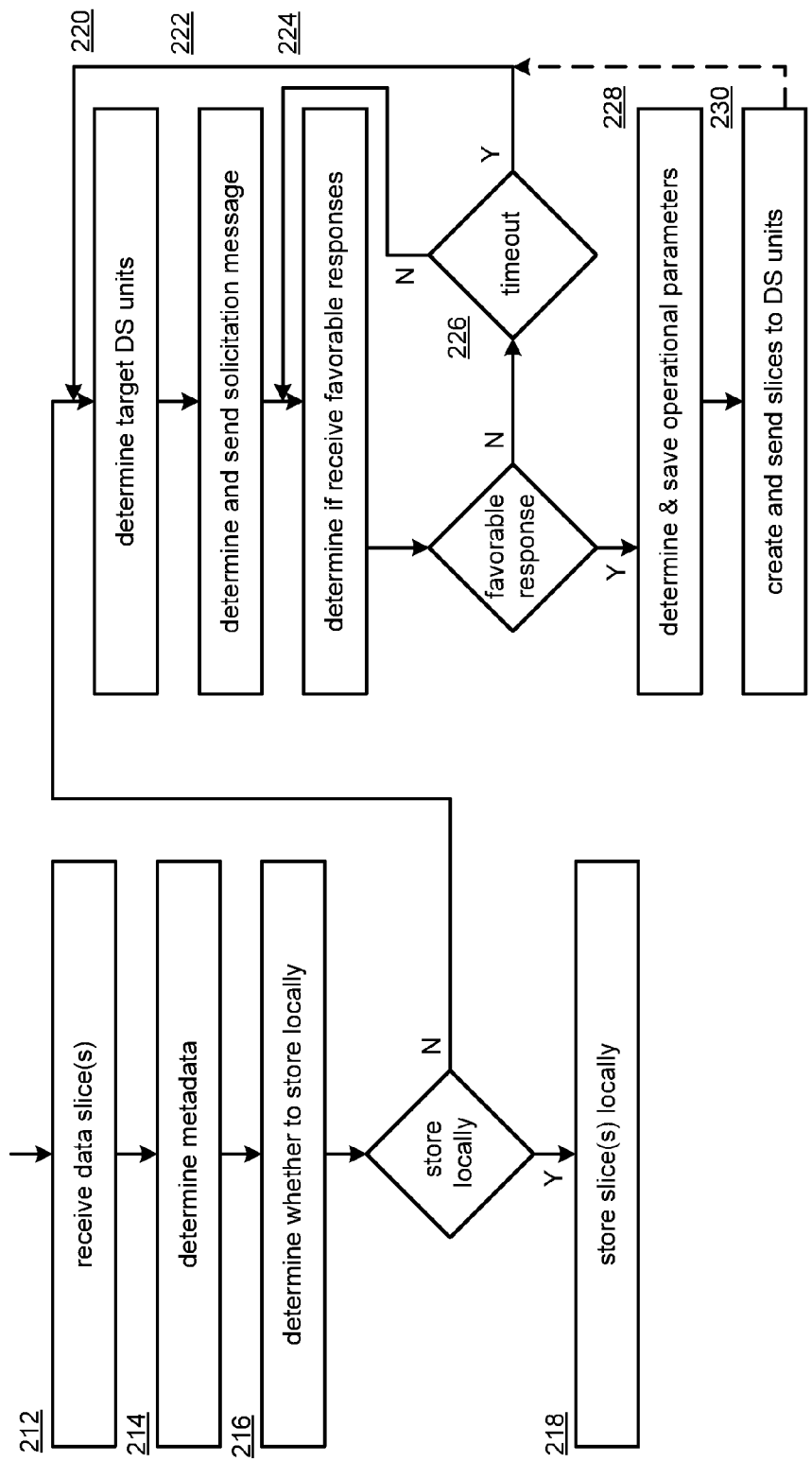
FIG. 14 is another flowchart illustrating another example of storing slices in accordance with the present invention.

FIG. 14 is another flowchart illustrating the storing of slices where the DS unit 36 coordinates the determination of other DS units to store slices to by way of a solicitation method described below. The method begins at step 212 where the DS unit receives one or more encoded data slices to store (e.g., from the DS processing 34).

The method continues at step 214 where the DS unit determines metadata associated with the one or more encoded data slices. The metadata includes one or more of, but is not limited to a hash of the data object, a hash of the slices, a priority requirement, a security requirement, a performance requirement, a data object size indicator, a data segment size indicator, a slice size indicator, a data type indicator, a location requirement, and/or a user ID. The determination may be based on one or more of the metadata, a user ID, a data object name, the slice names, the slices, a data type indicator, the data object, a calculated hash of the data object, a calculated hash of the data segment, a calculated hash of the slice, a priority indicator, a security indicator, a performance requirement, a command, a user vault lookup, geographic location of the user device, a location requirement, and/or a predetermination.

The method continues at step 216 where the DS unit determines whether to store at least a portion of the slices locally based on one or more of the metadata, DS unit status, DS unit memory availability, a command, a predetermination, historic DS unit performance, and/or DS unit loading 216. For example, the DS unit compares the memory requirements from the metadata to the memory availability and, when the comparison is favorable, indicates that it can store at least some of the slices locally and stores the slices locally at step 218.

When the DS unit cannot store all of the encoded data slices locally, the method continues at step 220 where the DS unit determines one or more target DS units that may be able to store at least one of the slices. Such a determination may be based on one or more of the metadata, a DS unit list, geographic locations of DS units, geographic location of the user device and/or DS processing unit, a command, a predetermination, a DSN memory status indicator, a DS unit solicitation response history indicator, and/or a DSN memory performance indicator. For example, the DS unit may select target DS units that are estimated to at least meet the requirements indicated by the metadata and may meet other requirements imposed by a command or a predetermination.

The message continues at step 222 where the DS unit generates a solicitation message and sends it to the target DS units. Note that the DS unit may send the solicitation message to the target DS units by way of one or more of a broadcast (e.g., all DS units), a unicast (e.g., one DS unit at a time), and/or a multicast (e.g., to a subset of DS units organized into a subset) transmission.

The method continues at step 224 where the DS unit determines whether it has a received one or more favorable responses to its solicitation message. The response may include a DS unit capability indicator (e.g., how much memory is available, a performance indicator, etc). When less than a sufficient amount of favorable responses have been received (i.e., for the slices that cannot be stored locally, one or more target DS units with enough memory to store the slices have favorably responded), the method continues at step 226 where a time out mechanism is enabled. If the time out period has not expired, the method repeats at step 224. If the timeout period has expired, the method repeats at step 220.

When a sufficient amount of favorable responses have been received, the method continues at step 228 where the DS unit determines operational parameters (e.g., discussed with reference to FIG. 3) and stores them. Such a determination may be based on one or more of the metadata, the number of favorably responding DS units, the DS unit capability indicator, a command, a predetermination, and/or a user vault lookup. For example, the DS unit may choose the pillar width n to be less than the number of favorably responding DS units and much larger than the read threshold k for storing a data segment in a storage set when utilizing the solicitation method. In another example, the DS unit may choose multiple storage sets that include the favorably responding DS units such that the slices of different data segments may be sent to different storage sets. The DS unit may include the storage set choices in the operational parameters.

The method continues at step 230 where the DS unit encodes and slices the received slices to create further slices for distribution in accordance with the operational parameters. For example, the DS unit passes the received slices directly to the chosen solicited DS units. The DS unit sends the slices to the chosen solicited DS units with a store command for subsequent storage in the chosen solicited DS units in accordance with the operational parameters 230. Note that the DS unit may send one slice, all the slices batched for a pillar of a data segment, all the slices of a data segment, or all the slices of all the data segments of the data object.

Figure 15:
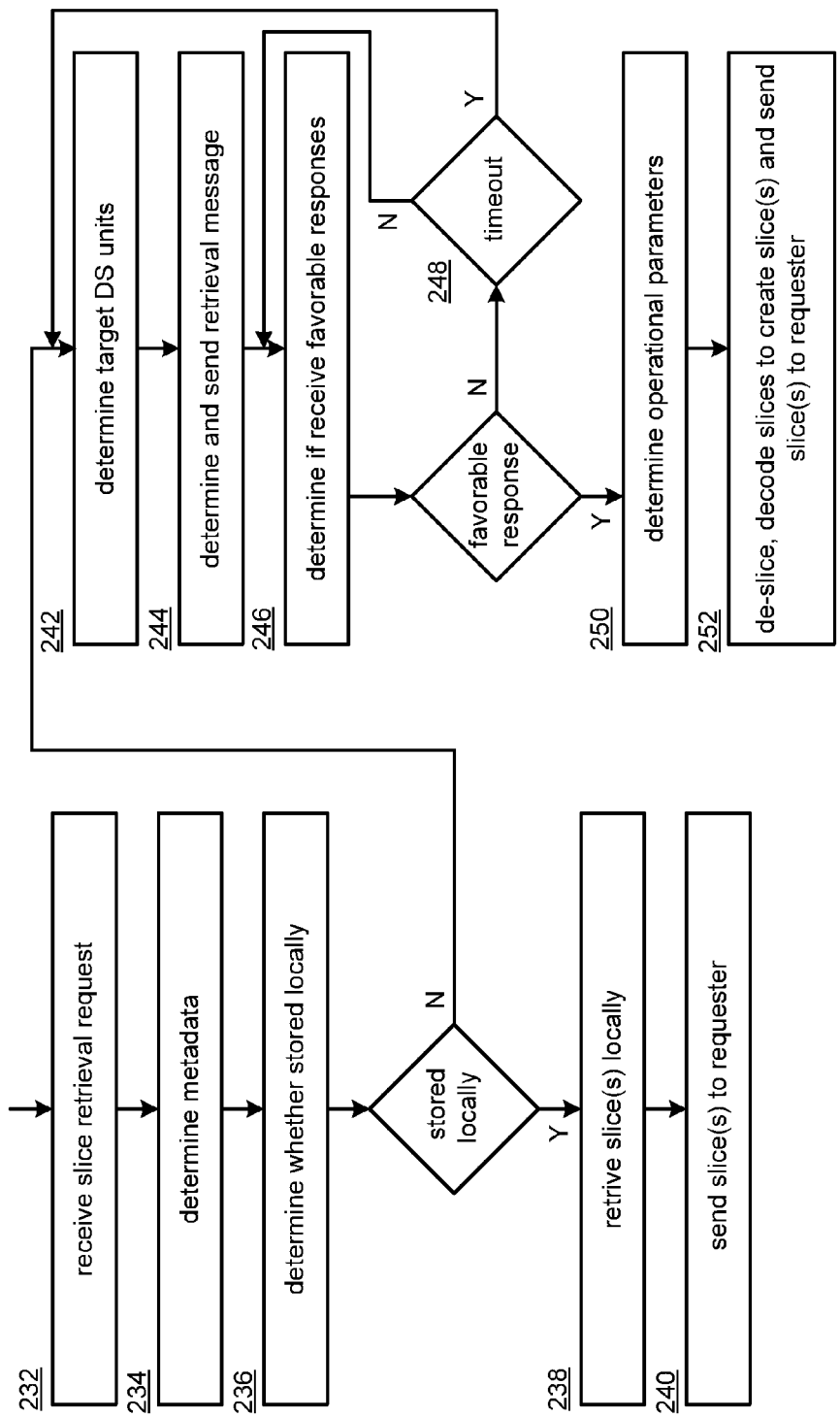
FIG. 15 is another flowchart illustrating another example of retrieving slices in accordance with the present invention.

FIG. 15 is another flowchart illustrating another example of retrieving of slices where the DS unit determines which other DS units to try to retrieve slices from by way of a retrieval solicitation method described below. The method begins at step of the DS unit receiving a request to retrieve slices (e.g., from a DS processing) 232. Note that the request may be for one or more slices. Further note that the DS unit may receive the slice names, the DS processing ID, the user ID, the data object name, and metadata associated with the data object.

The method continues at step 234 where the DS unit determines metadata based on one or more of the received metadata, the user ID, the DS processing ID, the data object name, a data type indicator, a previously calculated hash of the data object, a previously calculated hash of data segments, a priority indicator, a security indicator, a performance requirement, a command, a user vault lookup, geographic location of the user device, a location requirement, and/or a predetermination. The method continues at step 236 where the DS unit determines whether the slices are stored locally based on one or more of a lookup in a local virtual DSN address to physical location table, the metadata, DS unit status, DS unit memory availability, a command, a predetermination, historic DS unit performance, and/or DS unit loading 236. For example, the DS unit compares the slice names from the retrieval request to the slice names in the local virtual DSN address to physical location table to look for a match (e.g., stored locally).

When at least some of the slices are stored locally, the method continues at step 238 where the DS unit retrieves the locally stored slices. The method continues at step 240 where the DS unit sends the slices to a requesting device (e.g., the DS processing unit 34).

When at least some of the slices are not locally stored, the method continues at step 242 where the DS unit determines target DS units, which store the other slices. Such a determination may be based on one or more of the metadata, a DS unit list, geographic locations of DS units, geographic location of the user device, a command, a predetermination, a DSN memory status indicator, a DS unit solicitation response history indicator, and/or a DSN memory performance indicator. The DS unit may select target DS units that are estimated to at least meet the requirements indicated by the metadata and may meet other requirements imposed by a command or a predetermination.

The method continues at step 244 where the DS unit generates a retrieval message (e.g., a retrieval request, the metadata, slice names, and/or a requirements summary) and sends it to the target DS units. Note that the DS unit may send the retrieval message to the target DS units by way of one or more of a broadcast (e.g., all DS units), a unicast (e.g., one DS unit at a time), and/or a multicast (e.g., to a subset of DS units organized into a subset) transmission.

The method continues at step 246 where the DS unit receives a retrieval response from one or more DS units. The retrieval response includes the slices, the identity of the target DS unit, and or other relevant information. If the DS unit has not received a favorable number of slices (e.g. in combination with the locally stored slices, a read threshold number), the method continues at step 248 where a timeout mechanism is activated. If the timeout mechanism has not expired, the method repeats at step 246. If, however, the timeout mechanism has expired, the method repeats at step 242.

When the DS unit has received a favorable number of slices, the method continues at step 250 way or the DS unit determines operational parameters (e.g., discussed with reference to FIG. 3) based on one or more of the metadata, the number of favorably responding DS units, the DS unit capability indicator, a command, a predetermination, and/or a user vault lookup when the DS unit determines that sufficient favorable responses have been received. The method continues at step 252 where are the DS units de-slices and decodes the retrieved slices to recreate the data segment(s) and/or slices in accordance with the operational parameters. The DS processing then sends the reconstructed slices and/or data segments to the requester.

Figure 16:
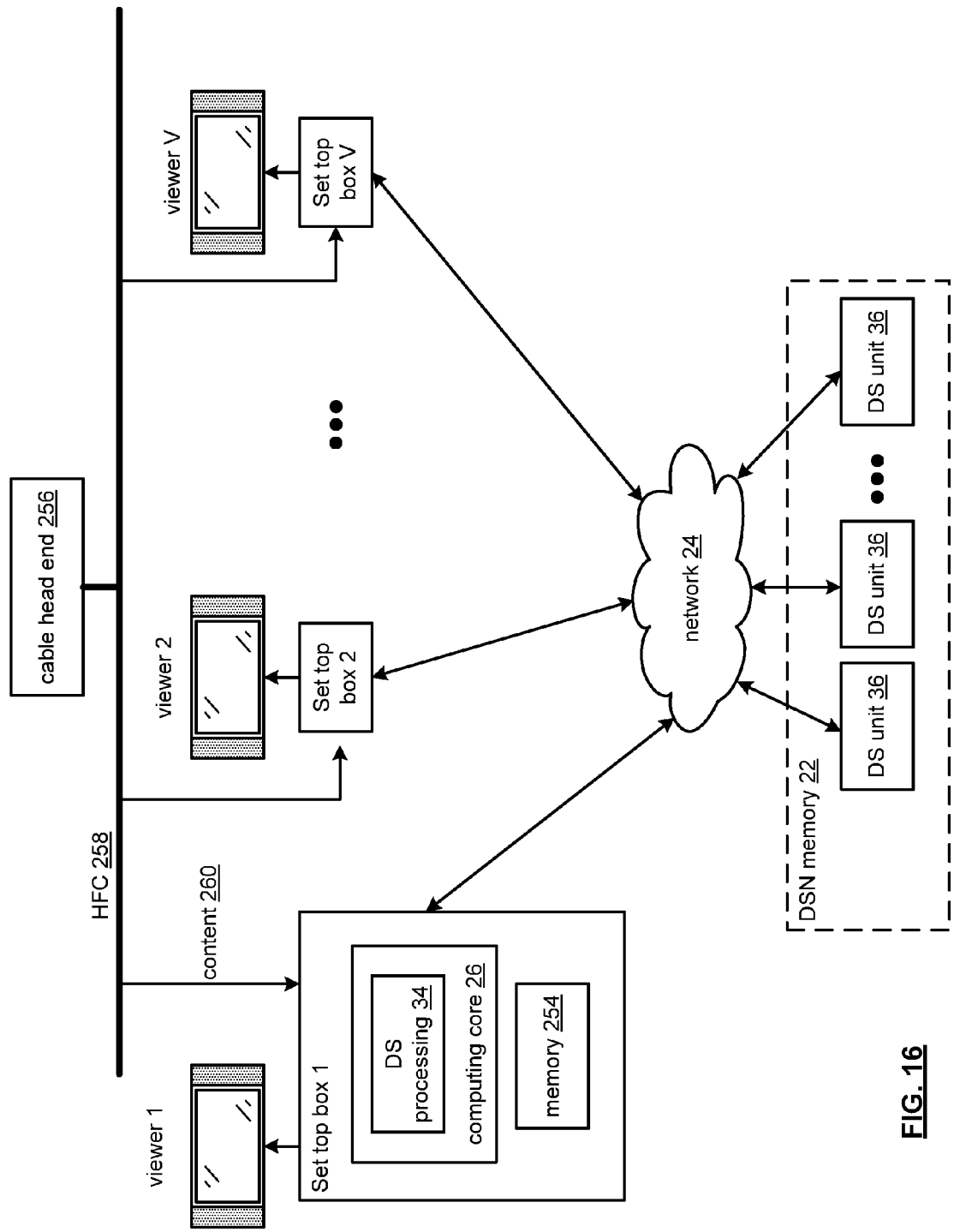
FIG. 16 is a schematic block diagram of an embodiment of a social television media storage system in accordance with the invention.

FIG. 16 is a schematic block diagram of an embodiment of a social television media storage system. As illustrated, the system includes a cable head end 256, a hybrid fiber coax (HFC) distribution 258, a plurality of viewers 1-V, a plurality of set top boxes 1-V (e.g., computers, cable set top boxes, satellite receivers, home entertainment systems, and/or electronic devices with memory and a computing core), the network 24, and the DSN memory 22. Members of the social network may invoke recording of cable television content via their set top boxes, where media content is distributedly stored on other set top boxes of other members of the social network and/or in the DSN memory 22.

The cable head end 256 may source broadcast, multicast, and/or unicast media content 260 via the HFC distribution 258 to the plurality of set top boxes 1-V. Alternatively, a satellite receiving system may substitute for the cable head end 256 and/or HFC 258. In another alternative, a content server (e.g., via the internet) and network 24 connection may substitute for the cable head end 256 and/or HFC 258.

The set top box may include the computing core 26 of FIG. 2, a memory 254, and the DS processing module 34. The DS processing module functions to transform media content into encoded data slices for storage and subsequent retrieval. The DS processing module 34 further functions to retrieve, de-slice, and decode encoded data slices to produce media data for viewing. The DS processing 34 may utilize the memory 254 to store media content 260 including media content in the form of encoded data slices. The set top box may select media content 260 from the cable head end 256 (e.g., broadcast/multicast or on-demand video over cable, satellite and/or the internet), stored media content 260 from the memory 254, stored media content 260 in other set top boxes, and/or media content 260 from the DSN memory 22. Note that the set top box may function as a DS unit to store slices.

As illustrated, the viewer includes a flat panel television and/or other type of display and speakers to reproduce the media. The viewer reproduces the media content (e.g., video, audio, pictures, web content) based on media content output from the set top box. The DS processing transforms the media content into a format compatible with the viewer 1-V. Alternatively, the functions of the set top box and the viewer are integrated together. For example, the viewer may connect either directly to other viewers and/or the DSN memory 22 to store and retrieve media slices.

In an example of operation, the DS processing module receives media content from the cable head end 256 in response to a selection. The DS processing selects the media content based on one or more of but not limited to selecting the media content from a media selection list, receiving a command from a media content source, and receiving a request from another member of the local social network (e.g., another member requests storage on their behalf). The media content may include one or more of but not limited to receiving the media content from a commercial media content provider, receiving the media content from a private media content provider, and receiving the media content from a member of the local social network.

The DS processing module determines social media metadata regarding the media content. The determination may be based on one or more of but not limited to determining other members of the local social network, determining that the other members have not previously encoded and facilitated storage of the media content, determining that at least one of the other members has indicated a desire to encode and facilitate storage of the media content, and receiving the social media metadata from a local social network manager.

The DS processing module determines if the social media metadata indicates that the media content is to be available for a local social network. For example, the DS processing module determines that the media content is to be available for the local social network when the DS processing module determines that the social media metadata indicates that at least one of the other members has indicated a desire to encode and facilitate storage of the media content.

The DS processing module encodes the media content to produce a plurality of sets of encoded data slices, identifies a plurality of memories, and sends the plurality of sets of encoded data slices to the plurality of memories to facilitate storage, as described in greater detail below, when the DS processing module determines that the social media metadata indicates that the media content is to be available for the local social network.

The DS processing module determines which portion of the media content to store based on a selection. For example, the viewer and/or set top box may indicate the selection to record or store in memory the 5:30 pm evening news on cable channel 188 on October 18 such that the viewer may subsequently access the content.

The DS processing module determines which media content element (e.g. a portion of the media content such as a particular show or program) stored in the memory 254 to distributedly store. The determination may be based on one or more of a command, a command from the cable head end 256, a command from at least one other set top box, a memory utilization indicator, and/or a predetermination. In another example, the DS processing module determines to distributedly store a movie when the memory utilization indicator is above a threshold (e.g., indicating that the memory 254 is almost full).

The DS processing module encodes the media content (e.g., media content element) in accordance with an error coding dispersal storage function to produce a plurality of sets of encoded data slices (e.g., sets of slices for each pillar of each data segment). The DS processing module identifies a plurality of memories to store the plurality of sets of encoded data slices. The plurality of memories includes one or more of but not limited to a memory associated with the distributed storage processing module of the current set top box, a memory within a member of the local storage network, and a memory of a dispersed storage network.

Alternatively, the DS processing module determines a method to distributedly store the media content element where the method may include one or more of the methods discussed previously with reference to FIGS. 6-15. The determination may be based on one or more of the social media metadata (e.g., availability of a group of set top boxes who share content to store encoded data slices), a performance requirement, a command, a command from the cable head end 256, a command from at least one other social network number set top box, a memory utilization indicator, and/or a predetermination. For example, the set top box may determine to utilize the solicitation method (e.g., discussed with reference to FIG. 6) where the target memories may comprise a plurality of set top boxes of the social network comprising a subset of the set top boxes 1-V. In other words, the DS processing module determines to distribute encoded data slices of the media content element to other set top boxes of the social network. In another example, the plurality of target memories may include one or more layers of organization of set top boxes from the plurality of set top boxes 1-V. Note that another layer may include one or more of a different social network, a physical location (e.g., set top boxes in the same building, set top boxes in the same neighborhood, set top boxes in the same city, etc.). Further note that the DS processing module may determine to utilize one or more DS units 36 of the DSN memory 22.

The multiple set top boxes may determine to distributedly store the same content element. For example, the set top box determines whether at least one other set top box in the social group of the set top box has previously distributedly stored the same content 260. The determination may be made based on one or more of a lookup in a table, querying a table in the other set top boxes of the same social group, querying a table in the user vault, querying a table in the DSN memory 22, searching the memory 254 in the other set top and/or boxes of the same social group.

The DS processing module sends the plurality of sets of encoded data slices to the plurality of memories identified as described above. In addition, the DS processing module may update one or more tables (e.g., and not re-store slices of the same content element) when the DS processing module determines that at least one other set top box in the social network of the set top box has distributedly stored the same media content. The DS processing module may update one or more tables, create EC data slices from the content element, and send the slices with a store command to the storage locations (e.g., determined by the method to distributedly store the content element) when the set top box determines that none of the other set top boxes in the social group of the set top box has distributedly stored the same content element. In another example, the DS processing module may update one or more tables, create EC data slices from the content element, and send the encoded data slices with a store command to the storage locations to facilitate storage (e.g., determined by the method to distributedly store the content element) when the set top box determines that at least one of the other set top boxes in the social network of the DS processing module has distributedly stored the same content element.

The DS processing module of the set top box retrieves encoded data slices of the media content, recreates the media content from the encoded data slices, and presents the media content to the viewer as described below. The set top box determines the method to distributedly retrieve the content element where the method may include one or more of the methods discussed previously with reference to FIGS. 6-15. In an instance, the determination may be made as previously discussed. For example, the set top box determines to utilize the solicitation method (e.g., discussed with reference to FIGS. 8-9) to retrieve slices where the target DS units 36 may be the social group comprising a subset of the set top boxes 1-V.

In an example of retrieval, the set top box retrieves content elements that the set top box previously stored distributedly (e.g., or any of the set top boxes invoked storing the content element) based on translating a media content ID (or accessing a DSN directory) into a virtual DSN address and retrieving the encoded slices in accordance with the retrieval method based on the DSN address. In other words, the set top box can determine the list of media content it has recorded.

In another example of retrieval, the set top box retrieves media content that the set top box did not previously store in a distributed fashion (e.g., but at least one other of the set top boxes invoked storing the content element) based on translating a media content ID (or accessing a DSN directory of another set top box) into a virtual DSN address and retrieving the encoded data slices in accordance with the retrieval method based on the DSN address. In other words, the DS processing module of the set top box can determine the list of media content that other set top boxes (e.g., in the same social group as the set top box) have recorded. In this example, set top boxes may share their DSN directories.

In another example of retrieval, a method begins with the DS processing module selecting media content to retrieve and obtaining social media metadata regarding the media content. The social media metadata may include one or more of but not limited to a media selection list, a social network member list, a stored media content list, and a dispersed-storage-address-to-memory-location table. The DS processing module may obtain the social media metadata by one or more of receiving the social media metadata from one or more of the other set top boxes in response to a request, receiving the social media metadata from the cable head end, receiving the social media metadata from a DS managing unit, and retrieving the social media metadata from a memory 254 of the set top box.

The method continues with the DS processing module retrieving a plurality of sets of encoded data slices from a plurality of memories based on the social media metadata. Note that the social media metadata may indicate which memories contain the encoded data slices. The plurality of memories comprises one or more of but not limited to a memory associated with the distributed storage processing module, a memory within a member of the local storage network, and a memory of a dispersed storage network.

The method continues with the DS processing module re-creating the media content from the plurality of sets of encoded data slices in accordance with an error coding dispersal storage function. The DS processing module determines members of the social network to receive the reconstructed media content to produce identified members. The DS processing module sends the reconstructed media content to the identified members. Alternatively, the DS processing module encrypts the media content and/or compresses the media content prior to transmitting the reconstructed media content. In another alternative, the DS processing module determines a display protocol for each of the identified members and converts a format of the reconstructed media content in accordance with the display protocol of one of the identified members. In other words, the DS processing module converts the reconstructed media content into a format compatible with the identified members.

Figure 17:
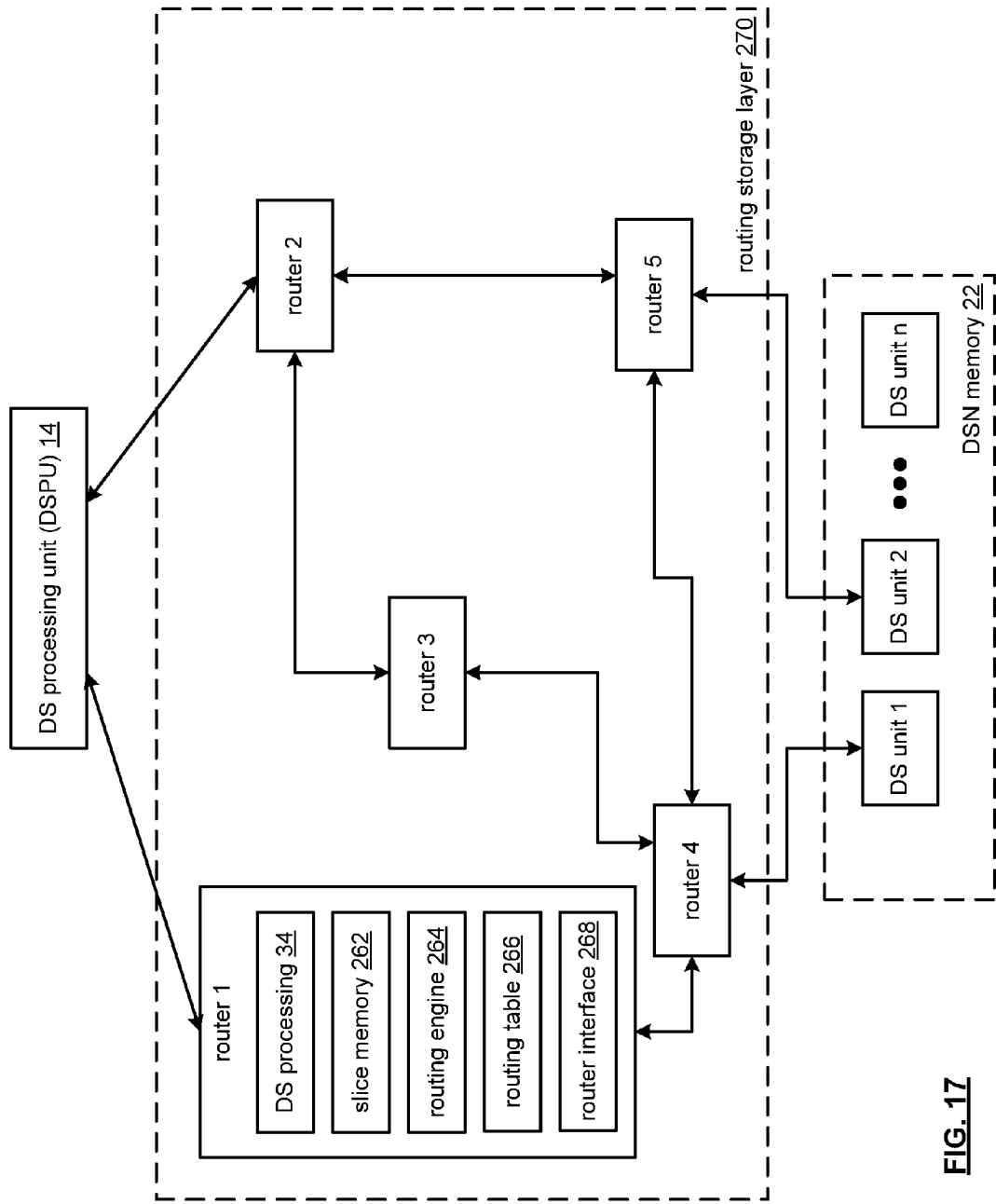
FIG. 17 is a schematic block diagram of an embodiment of a distributed storage system utilizing a routing storage layer in accordance with the invention.

FIG. 17 is a schematic block diagram of an embodiment of a distributed storage system utilizing a routing storage layer 270 to supplement the DSN memory 22 (e.g., a DS processing unit 14 may store slices in the routing storage layer 270 and/or a DSN memory 22) as described in more detail with reference to FIGS. 17-21.

As illustrated, the system includes the DS processing unit 14, the routing storage layer 270, and the DSN memory 22. The DSN memory 22 includes a plurality of DS units 1-n. The routing storage layer 270 includes a plurality of routers that function to operably couple the DS processing unit 14 and the DSN memory 22 as well as to store encoded data slices. For example, the routing storage layer 270 includes routers 1-5 that operably couple the DS processing unit 14 to the DSN memory 22. Note that the routing storage layer 270 may include at least a portion of the network.

Router 1, which is representative of the other routers, includes a DS processing 34, a slice memory 262, a routing engine 264, a routing table 266, and a router interface 268. The router may be fixed or portable and implemented utilizing the computer core of FIG. 2. The router interface 268 couples other system elements to the router to receive and transmit data packets and may be wire lined or wireless and may couple to any number of other routers or system elements. The routing engine 264 receives data packets via the router interface 268, processes the received data packets, communicates with the DS processing 34, utilizes the routing table 266, forms transmit data packets to be transmitted, and transmits the transmit data packets via the router interface 268.

The router receives data packets from one system element and forwards the data packets to another system element. For example, router 1 receives data packets targeting DS unit 1 from the DS processing unit 14 and forwards the data packets to the DS unit 1 through router 4. Alternatively, or in addition, the router may receive data packets from one system element and forward the data packets through multiple other routers to another system element. For example, router 1 receives data packets targeting DS unit 2 from the DS processing unit 14 and forwards the data packets through router 4, through router 3, through router 2, and through router 5 to the DS unit 2. The routing engine 264 determines how the router will process the received data packet, where the router will send the transmit data packets (e.g., the destination), and what route (e.g., path) will be utilized.

The routing engine 264 determines the connections between routers and populates the routing table 266 with entries to signify the connections between routers. The determination may be based on one or more of a predetermination, a command, and/or discovery. In addition, the routing engine 264 performs the discovery by sending discovery messages via the router interface 268 and receiving responses via the router interface 268 noting which portion of the router interface 268 received which messages. The discovery message may include a router ID, a discovery command, and a performance indicator. Further, the routing engine 264 updates the routing table contents from time to time as system topology dynamically changes. An example of a populated routing table is discussed in greater detail with reference to FIG. 18.

The routing engine 264 determines where to forward the slices within the dispersed storage network using one or more methods previously discussed with reference to FIGS. 10-13 based on the routing table 266. For example, the routing engine 264 chooses to forward slices down the path of router 2 to router 3 to router 4 based on the routing table 266 indicating those routers are linked in that order. Note that the system benefit may be less network traffic.

The router DS processing 34 creates error coded data slices from data or recreates data from slices less supporting the distributed storage methods previously discussed with reference to FIGS. 14-15. The DS processing 34 stores error coded data slices in the slice memory 262 of the router or in the slice memory 262 of other routers. For example, router 1 creates and sends slices to routers 3 and 5 based on receiving a slice from the DS processing unit 14 to further slice and store. Note that, in this fashion, the router may function as a DS unit.

The DS processing unit 14 determines routers to store and retrieve slices in accordance with a distributed storage method previously discussed with reference to FIGS. 6-15 and based in part on the routing table 266. For example, the DS processing unit 14 determines to store slices in router 1 since the routing table 266 reveals that router 1 is connected directly to the DS processing unit 14 and fast performance is favored. In another example, the DS processing unit 14 determines to store slices in router 3 since the routing table 266 reveals that there are at least four routes between router 3 and the DS processing unit 14 and connection reliability is favored over fast performance. The DS processing unit 14 method of determining routers is discussed in greater detail with reference to FIGS. 18-19.

In an example, the router DS processing 34 determines to affiliate with one or more DS units in the DSN memory 22 or within another router to produce an affiliation. The determination may be based on one or more of a router status indicator, a command, the routing table 266, and metadata associate with the error coded data slice. The routing engine 264 subsequently determines how to route and potentially store data in the router slice memory 262 as slices based in part on the affiliation (e.g., store in the slice memory 262 in place of or in addition to the DS unit). For example, the router 4 DS processing 34 determines to affiliate with DS unit 1 due to the direct connection. The router 5 DS processing 34 determines to affiliate with DS unit 2 due to the direct connection. As a more specific example, the router 5 routing engine 264 determines to temporarily store error coded data slices intended for DS unit 2 in the router 5 slice memory 262. The router DS processing method of determining and utilizing DS unit affiliation is discussed in greater detail with reference to FIGS. 20-21.

FIG. 18 is an example table representing a routing table 266 for the topology of the example depicted with reference to FIG. 17. The routing table 266 includes entries for source identifiers (ID) of source nodes, destination identifiers (ID) for destination nodes, a route ID, a route priority, and a route. The route ID signifies a unique route between, from and to nodes through the nodes listed in the route field, which are determined by the routing engine as previously discussed (e.g., via sending and receiving discovery messages). Each route permutation is listed as a unique route. The route priority field signifies a rating of the associated route. The route signifies the system nodes along a path from the source node to the destination node.

The routing engine determines the route priority in a step subsequent to discovering possible routes by rating the permutations of routes sharing the same from and to nodes with respect to each other. The example in FIG. 18 indicates one such rating scheme based on estimated latency performance (e.g., to minimize time delays through the routing storage layer by minimizing the hops through different nodes). For example, route 3 of the DSPU to DS unit 1 route has a route priority of 1 since it has the fewest number of nodes along the route as compared to routes 1 and 2 and hence has the lowest estimated latency.

Alternatively, the routing engine determines more entry columns to depict other facets including the estimated or measured performance of the links between the nodes to enable further refinement of performance based decisions. Note that the performance entry may depict latency, speed, capacity, error rates, etc.

Alternatively, additional entries may be added to the routing table 266 to depict all the routes between every two elements and nodes of the system. The routing table 266 may be utilized in part by the DS processing unit, router DS processing, and/or the routing engine to determine how to route data packets, where to store slices, where to retrieve slices, where to forward slices, and how to establish affiliations. The methods to utilize the routing table 266 methods will be discussed in greater detail with reference to FIGS. 19-21.

Figure 19:
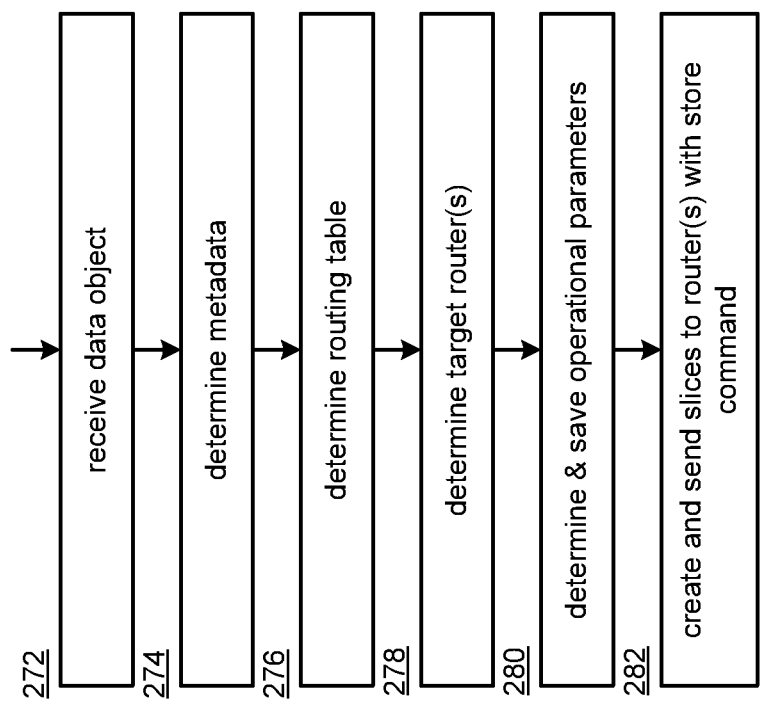
FIG. 19 is a flowchart illustrating an example of determining routers in accordance with the present invention.

FIG. 19 is a flowchart illustrating the determination of routers where a DS processing module determines which router to send error coded data slices to for storage or for forwarding to another router based in part on the routing table. The DS processing may be implemented in a processing module of a router, a user device, a DS processing unit, a DS managing unit, a storage integrity processing unit, and/or a DS unit. For example, the processing module performing the DS processing function is implemented in the router.

The method begins at step 272 where the processing module receives data for storage. The processing module may receive the data from a source associated with a source identifier (ID) or from another router. In addition, the processing module may receive a user ID, a data object name, and metadata associated with the data. The method continues at step 274 where the processing module determines metadata, which includes one or more of but not limited to a hash of the data, a priority requirement, a security requirement, a performance requirement, a size indicator, a data type indicator, a location requirement, and a user ID. The determination may be based on one or more of the received metadata, the user ID, the data object name, a data type indicator, the data object, a calculated hash of the data object, a priority indicator, a security indicator, a performance requirement, a command, a user vault lookup, geographic location of the user device, a location requirement, and a predetermination.

The processing module interprets the data to determine whether the data is to be forwarded or error encoded. The interpretation may be based on one or more of but not limited to the data, the metadata, a command, a predetermination, a lookup, and a message. When the data is to be encoded, the processing module encodes the data using an error coding dispersal storage function to produce error encoded data (e.g. a plurality of sets of encoded data slices). The processing module then determines whether to forward the data or error encoded data to local memory or to another router. The determination is based on one or more of but not limited to a memory status indicator, the data, the metadata, a command, a predetermination, a lookup, and a message. For example, the processing module determines to utilize the local memory when memory status indicator indicates favorable memory capacity. The processing module outputs the data to the local memory when the data is to be forwarded to the local memory. Alternatively, the processing module outputs the data to the other router when the data is to be forwarded to the other router.

When data is to be forwarded to another router, the method continues at step 276 where the processing module determines the routing table. The determination may be based on one or more of but not limited to a source identifier (ID) associated with the data, a destination identifier (ID) associated with the data, and information regarding a plurality of routing options. The processing module may obtain the routing table through at least one of receiving the routing table in response to a request message, retrieving the routing table from a routing table database, receiving the routing table in conjunction with receiving the data, and receiving metadata associated with the data and utilizing the metadata to obtain the routing table.

The method continues at step 278 where the processing module determines target router (or routers for a storage set) by selecting a routing option from the plurality of routing options. The processing module selects the routing option based on one or more of but not limited to the metadata, requirements indicated by a router status indicator, a router performance history indicator, a router attributes list (e.g., maximum memory), an available router memory indicator, a maximum number of routes from the DS processing unit to the candidate storage node (router), a minimum number of nodes along the route from the DS processing unit to the candidate storage node, a source associated with the source ID, a destination associated with the destination ID, routing performance information, a routing preference (e.g., from the router perspective), and a routing requirement (e.g., from the source perspective). For example, the processing module determines to target router 2 since it has enough memory and is just one node away from the DS processing unit. In another example, the processing module determines to target router 5 since it has enough memory and is just two nodes away from the DS processing unit when router 2 did not have enough memory. Note that the processing module may or may not save which router was chosen based on the distributed storage method as previously discussed.

The method continues at step 280 where the processing module determines error coding dispersal storage function parameters based on the routing option. The determination is based on one or more of but not limited to the target router(s), the metadata, a capability indicator of the target router(s), a command, a predetermination, and a user vault lookup. In this step, the processing module may save the parameters in a user vault, in the metadata, and/or another memory and may or may not save the target router choices (e.g., per slice name and/or data segment ID) in the user vault, a virtual DSN address (e.g., slice name) to physical location table, and/or another memory. In an alternative, the processing module performs subsequent error coded data slice retrievals through another method when the processing module does not save the target router choices. In another alternative, the processing module performs subsequent error coded data slice retrievals by looking up in memory where the slices are stored when the processing module saves the target router choices.

The method continues at step 282 where the processing module encodes the data based on the error coding dispersal storage function parameters to produce a plurality of sets of encoded data slices. Note that a set of the encoded data slices may pertain to error coded data slices of each pillar of one data segment. The plurality of sets of encoded data slices may pertain to the error coded data slices of all the data segments of the data. In addition, the processing module unit may append the metadata to the error coded data slices and send the slices (e.g., to the target routers with a store command for subsequent storage in the target routers). Note that the processing module may send one slice, all the slices batched for a pillar of a data segment, all the slices of a data segment, or all the slices of all the data segments of the data object. The method may branch back to the step where the processing module determines the target router(s) when the DS processing unit is not finished creating and sending slices for the data. For example, the steps described above may repeat for the next data segment.

At step 282, the processing module determines whether one of the plurality of pillars of encoded data slices is to be stored locally as discussed previously. The processing module outputs the one of the plurality of pillars of encoded data slices to a local memory when the one of the plurality of pillars of encoded data slices is to be stored locally.

Continuing at step 282, the processing module outputs at least some of the encoded data slices of a set of the plurality of sets of encoded data slices to an entry point of the routing option. Note that the entry point may be another router where the data is subsequently sent to other routers for forwarding or error encoding and distributed storage. Note that the processing module partitions the plurality of sets of encoded data slices into a plurality of pillars of encoded data slices, determining destinations for each of the plurality of pillars of encoded data slices in accordance with the destination ID, and outputting the plurality of pillars of encoded data slices to the destinations.

Alternatively, the processing module sends at least a write threshold of one set of the plurality of sets of encoded data slices to the top rated routers for storage. The write threshold may be the minimum number of pillars allowed to successfully store to in accordance with the operational parameters. Note that the write threshold is equal to or greater than the read threshold k and less than or equal to the pillar width n. The processing module may send any remaining pillars of error coded data slices beyond the write threshold number to routers with a rating that is equal to or less than the rating of the top rated routers for storage.

FIG. 20 is a flowchart illustrating the affiliation determination of a router where the router utilizes the routing table to affiliate with a DS unit. The method may be implemented in a processing module of a router, a user device, a DS processing unit, a DS managing unit, a storage integrity processing unit, and/or a DS unit. For example, the processing module is implemented in the router.

The method begins at step 284 where the processing module determines the routing table. The determination may be based on one or more of but not limited to querying the routing table, querying the routing engine, and performing the discovery method previously described (e.g., the processing module of the router pings other routers).

The method continues at step 286 where the processing module determines an affiliation based on one or more of but not limited to the routing table, a DS unit status indicator, metadata of a storage sequence, requirements indicated by a router status indicator, a router performance history indicator, a router attributes list (e.g., maximum memory), an available router memory indicator, a maximum number of routes from the router to the candidate DS unit, a minimum number of nodes along the route from the router to the candidate DS unit, and a previous or present router affiliation with a DS unit.

For example, the router 4 processing module may determine to affiliate with DS unit 1 since the DS unit 1 status indicator indicates it is busy and/or needs help, and is just one node away from the router 4 DS processing.

The method continues at step 288 where the processing module sends an affiliation request message to the DS unit that an affiliation be created. Next, at step 290 the processing module receives an affiliation request response message that may indicate if the DS unit agrees to the affiliation with a response (e.g., yes or no). The DS unit determines whether the DS unit requires the help or not. For example, if the DS unit is temporarily falling behind in DS unit activities, it may agree to the affiliation.

The method continues at step 292 where the processing module determines whether the affiliation request response message is favorable (e.g., favorable=yes and/or agree). The method branches back to step 284 when the processing module determines that the affiliation request response message is not favorable. The method continues to step 294 when the processing module determines that the affiliation request response message is favorable. At step 294 where the processing module saves the affiliation to the DS unit in one or more of the routing table, a slice memory, and DSN memory when the processing module determines that the affiliation request response message is favorable.

FIG. 21 is a flowchart illustrating the routing of data where the router determines how to route traffic and/or store slices based in part on an affiliation to a DS unit. The method may be implemented in a processing module of a router, a user device, a DS processing unit, a DS managing unit, a storage integrity processing unit, and/or a DS unit. For example, the processing module is implemented in the router.

The method begins at step 296 where the processing module receives a data packet. The data packet includes an encoded data slice of a set of encoded data slices, wherein a data segment is encoded using an error coding dispersal storage function to produce the set of encoded data slices. At step 298, the processing module inspects the data packet (e.g., opens the packets to find control, payload and routing information such as the destination node, next node) to determine a destination of the data packet. The destination may include a dispersed storage unit of a dispersed storage network.

The method continues at step 300 where the processing module determines whether the router has an affiliation with the destination. The determination is based on one or more of but not limited to accessing a router table database and receiving metadata (e.g., the metadata indicates the affiliation). In addition, the processing module may determine whether another router does not have an active affiliation with the destination. Note that the processing module indicates that the router does not have the affiliation and forwards the data packet to the other router when the other router does have the active affiliation. Alternatively, the processing module determines to establish an active affiliation with the destination when the other router does not have the active affiliation. The processing module determines the active affiliation based on one or more of but not limited to a destination performance indicator, a maximum number of routes, a minimum number of routes, and an affiliation history record.

The method continues at step 302 where the processing module determines target DS unit based in part on the data packet (e.g., the destination node). For example, the DS unit ID and/or internet protocol address may be contained in the data packet. The method continues at step 304 where the processing module determines whether the router is affiliated with the target DS unit based on comparing the retrieved affiliation with the target DS unit. Note that a match indicates the router is affiliated with the target DS unit.

The method continues at step 306, the processing module sends the received data packets to the next node (e.g., from the inspection information, a header, a determination by the routing engine based on the destination node and the routing table) when the routing engine determines that the router is not affiliated with the target DS unit. The method continues to step 308 when the processing module determines that the router is affiliated to the destination target.

At step 308, the processing module determines whether to temporarily locally store the data packet. The determination is based on at least one of interpreting metadata associated with the data packet, interpreting historical data traffic of the destination, interpreting current data traffic of the destination, and receiving a request from the destination. For example, the processing module determines to temporarily locally store the data packet when an indication of current data traffic of the destination indicates that the data traffic is very high. In addition, the processing module locally stores the data packet (e.g. caches) in the router slice. Note that the router may store the slices for a temporary or long term period.

The method continues at step 310 where the processing module determines a transfer protocol. The transfer protocol may include one or more of but not limited to forwarding the data packet at expiration of a time interval, forwarding the data packet during a given time of the day, forwarding the data packet in response to a request from the destination, forwarding the data packet when a local memory utilization is above a threshold, forwarding the data packet in response to a change in routing table information, and forwarding the data packet in response to a change in the affiliation. The determination of the transfer protocol may be based on one or more of but not limited to the routing table, a DS unit status indicator, the metadata of the slices, requirements indicated by a router status indicator, a router performance history indicator, a router attributes list (e.g., maximum memory), an available router memory indicator, a maximum number of routes from the router to the candidate DS unit, a minimum number of nodes along the route from the router to the candidate DS unit, and a previous or present router affiliation with a DS unit.

The method continues at step 312 where the processing module forwards the data packet to the destination in accordance with the transfer protocol. In addition the processing module may respond to a write request associated with the data packet, wherein the write request may include one of a write request message, a commit request message, and a finalize request message. For example, the processing module sends a write request acknowledgment message to the DS processing unit in response to receiving the write request message. In another example, the processing module sends a commit acknowledgment message to the DS processing unit in response to receiving the commit request message. In another example, the processing module sends a finalize acknowledgment the message to the DS processing unit in response to receiving the finalize request message. In addition, the processing module determines whether the error coded data slices are stored in the local memory first upon subsequent retrieval sequences before forwarding an associated retrieval command to the affiliated DS unit (e.g., when the slices are not cached in the router).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A method for execution by a dispersed storage processing module, the method comprises:
   receiving media content;
   determining social media metadata regarding the media content; and
   when the social media metadata indicates that the media content corresponds to a local social network:
      encoding the media content in accordance with an error coding dispersal storage function associated with the local social network to produce a plurality of sets of encoded data slices;
      identifying a plurality of memories to store the plurality of sets of encoded data slices; and
      sending the plurality of sets of encoded data slices to the plurality of memories.

2. The method of claim 1 further comprises:
   receiving the media content in response to a selection, wherein the selection includes at least one of:
      selecting the media content from a media selection list;
      receiving a command from a media content source; and
      receiving a request from another member of the local social network.

3. The method of claim 1, wherein the determining the social media metadata further comprises one or more of:
   determining other members of the local social network;
   determining that the other members have not previously encoded and facilitated storage of the media content;
   determining that at least one of the other members has indicated a request to encode and facilitate storage of the media content; and
   receiving the social media metadata from a local social network manager.

4. The method of claim 1, wherein the plurality of memories comprises one or more of:
   a memory within a member of the local storage network; and
   a memory of a dispersed storage network.

5. The method of claim 1, wherein the receiving the media content comprises at least one of:
   receiving the media content from a commercial media content provider;
   receiving the media content from a private media content provider; and
   receiving the media content from a member of the local social network.

6. A method for execution by a dispersed storage processing module, the method comprises:
   selecting media content to retrieve;
   obtaining social media metadata regarding the media content;
   retrieving a plurality of sets of encoded data slices from a plurality of memories based on the social media metadata;
   re-creating the media content from the plurality of sets of encoded data slices in accordance with an error coding dispersal storage function associated with a local social network to produce reconstructed media content;
   determining, based on the social media metadata, members of the local social network to receive the reconstructed media content to produce identified members; and
   sending the reconstructed media content to the identified members.

7. The method of claim 6, wherein the plurality of memories comprises one or more of:
- a memory within a member of the local storage network; and
- a memory of a dispersed storage network.

8. The method of claim 6, wherein the social media metadata comprises at least one of:
- a media selection list;
- a social network member list;
- a stored media content list; and
- a dispersed-storage-address-to-memory-location table.

9. The method of claim 6, wherein the sending further comprises at least one of:
- encrypting the media content; and
- compressing the media content.

10. The method of claim 6, wherein the sending further comprises:
- determining a display protocol for each of the identified members; and
- converting format of the reconstructed media content in accordance with the display protocol of one of the identified members.

11. A dispersed storage processing module comprises:
an interface;
a memory; and
a processing module operable to:
- receive, via the interface, media content;
- determine social media metadata regarding the media content; and
- when the social media metadata indicates that the media content corresponds to a local social network:
  - encode the media content in accordance with an error coding dispersal storage function associated with the local social network to produce a plurality of sets of encoded data slices;
  - identify a plurality of memories to store the plurality of sets of encoded data slices; and
  - send, via the interface, the plurality of sets of encoded data slices to the plurality of memories.

12. The dispersed storage processing module of claim 11 is further operable to:
- receive, via the interface, the media content in response to a selection, wherein the selection includes at least one of:
  - selecting the media content from a media selection list;
  - receiving a command from a media content source; and
  - receiving a request from another member of the local social network.

13. The dispersed storage processing module of claim 11, wherein the processing module further functions to determine the social media metadata by one or more of:
- determining other members of the local social network;
- determining that the other members have not previously encoded and facilitated storage of the media content;
- determining that at least one of the other members has indicated a request to encode and facilitate storage of the media content; and
- receiving, via the interface, the social media metadata from a local social network manager.

14. The dispersed storage processing module of claim 11, wherein the plurality of memories comprises one or more of:
- the memory within the dispersed storage processing module;
- a memory within a member of the local storage network; and
- a memory of a dispersed storage network.

15. The dispersed storage processing module of claim 11, wherein the processing module further functions to receive the media content by at least one of:
- receiving, via the interface, the media content from a commercial media content provider;
- receiving, via the interface, the media content from a private media content provider; and
- receiving, via the interface, the media content from a member of the local social network.

16. A dispersed storage processing module comprises:
an interface;
a memory; and
a processing module operable to:
- select media content to retrieve;
- obtain social media metadata regarding the media content;
- retrieve, via the interface, a plurality of sets of encoded data slices from a plurality of memories based on the social media metadata;
- re-create the media content from the plurality of sets of encoded data slices in accordance with an error coding dispersal storage function associated with a local social network to produce reconstructed media content;
- determine members of the local social network to receive the reconstructed media content to produce identified members; and
- send, via the interface, the reconstructed media content to the identified members.

17. The dispersed storage processing module of claim 16, wherein the plurality of memories comprises one or more of:
- the memory within the dispersed storage processing module;
- a memory within a member of the local storage network; and
- a memory of a dispersed storage network.

18. The dispersed storage processing module of claim 16, wherein the social media metadata comprises at least one of:
- a media selection list;
- a social network member list;
- a stored media content list; and
- a dispersed-storage-address-to-memory-location table.

19. The dispersed storage processing module of claim 16, wherein the processing module further functions to send by at least one of:
- encrypting the media content; and
- compressing the media content.

20. The dispersed storage processing module of claim 16, wherein the processing module further functions to send by at least one of:
- determining a display protocol for each of the identified members; and
- converting format of the reconstructed media content in accordance with the display protocol of one of the identified members.

* * * * *